US008988049B2

(12) United States Patent
Midya

(10) Patent No.: US 8,988,049 B2
(45) Date of Patent: Mar. 24, 2015

(54) MULTIPLE SWITCH POWER STAGE CONTROL TRACKING PCM SIGNAL INPUT

(71) Applicant: Pallab Midya, Palatine, IL (US)

(72) Inventor: Pallab Midya, Palatine, IL (US)

(73) Assignee: Futurewei Technologies, Inc., Plano, TX (US)

( * ) Notice: Subject to any disclaimer, the term of this patent is extended or adjusted under 35 U.S.C. 154(b) by 161 days.

(21) Appl. No.: 13/921,395

(22) Filed: Jun. 19, 2013

(65) Prior Publication Data
US 2014/0375382 A1 Dec. 25, 2014

(51) Int. Cl.
H02M 3/156 (2006.01)
H03G 3/30 (2006.01)

(52) U.S. Cl.
CPC ................................. H03G 3/3042 (2013.01)
USPC ............................. 323/241; 323/272; 323/283

(58) Field of Classification Search
USPC .................................. 323/237, 341, 272, 283
See application file for complete search history.

(56) References Cited

U.S. PATENT DOCUMENTS

| 4,713,742 | A * | 12/1987 | Parsley ........................ 363/124 |
| 6,605,991 | B2  | 8/2003  | Midya et al. |
| 6,606,044 | B2 * | 8/2003  | Roeckner et al. ............. 341/143 |
| 6,819,912 | B2  | 11/2004 | Roeckner et al. |
| 7,130,346 | B2  | 10/2006 | Midya et al. |
| 7,227,487 | B1  | 6/2007  | Midya et al. |
| 7,777,563 | B2  | 8/2010  | Midya et al. |
| 7,825,726 | B2 * | 11/2010 | Midya et al. ................... 330/10 |
| 8,315,302 | B2 * | 11/2012 | Lewis ........................... 375/238 |
| 2003/0122692 | A1 * | 7/2003 | Roeckner et al. .............. 341/53 |
| 2010/0238060 | A1 * | 9/2010 | Nien et al. .................... 341/155 |

OTHER PUBLICATIONS

Pallab Midya and Bill Roeckner, Large-Signal Design and Performance of a Digital PWM Amplifier, J. Audio Eng. Soc., vol. 58, No. 9, 2010, pp. 1-14.
Pallab Midya, Generation of Variable Frequency Digital PWM, Audio Engineering Society Convention Paper 7227 Presented at the 123rd Convention Oct. 5-8, 2007 New York, NY, USA, 10 pages.
Pallab Midya and Matt Miller and Mark Sandier, Integral Noise Shaping for Quantization of Pulse Width Modulation, Audio Engineering Society109th Convention Sep. 22-25, 2000 Los Angeles, California, USA, cover sheet plus pp. 1-29.

* cited by examiner

*Primary Examiner* — Timothy J Dole
*Assistant Examiner* — Ishrat Jamali
(74) *Attorney, Agent, or Firm* — Slater & Matsil, L.L.P.

(57) ABSTRACT

A DC power stage provides a power output that tracks a PCM signal input. A mapping unit generates an integer number of N digital PWM signals each switched at a same switching frequency by switching states of the PWM signals one at a time based on a level of the PCM signal input. An imbalance correction unit adjusts a duty ratio of the PWM signals relative to one another based on differentially accumulating errors among the PWM signals to prevent divergence of PWM signals. N corresponding switches therefrom switch power from a DC power source. N inductances in parallel produce a combined signal that is low pass filtered to provide the power output. Switching is between only those state combinations where the switching frequency is cancelled in the combined signal. The switching frequency is a sampling frequency of the PCM signal input divided by a product of 2 times N.

20 Claims, 27 Drawing Sheets

US 8,988,049 B2

MULTIPLE SWITCH POWER STAGE CONTROL TRACKING PCM SIGNAL INPUT

BACKGROUND OF THE INVENTIONS

1. Technical Field

The present inventions relate to PCM to a set of digital PWM signals and, more particularly, relate to PCM to a set of digital PWM signals for multiple switch power stage control.

2. Description of the Related Art

Envelope Tracking is a method of powering the RF (radio frequency) power amplifier using a power signal which is a function of the RF signal envelope to improve power conversion efficiency of an RF envelope. As bandwidth of the RF signal increases for newer signals like 3G and 4G cellular standards, there is a move towards the use of digital circuitry to create the PWM (pulse width modulation) signals. The switching frequency of the PWM signal has to be significantly greater than the bandwidth of the RF signal envelope. As the bandwidth of the RF signal envelope goes into tens of MHz (megahertz) and higher the switching frequency of the PWM would get into the hundreds of MHz. The efficiency of a switching signal operating at such a high switching frequency is low due to the switching losses associated with the PWM power stage. As a result the efficiency of the envelope tracking RF power amplifier is reduced which is highly undesirable.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The details of the preferred embodiments will be more readily understood from the following detailed description when read in conjunction with the accompanying drawings wherein.

DETAILED DESCRIPTION OF THE PREFERRED EMBODIMENTS

Figure 1:
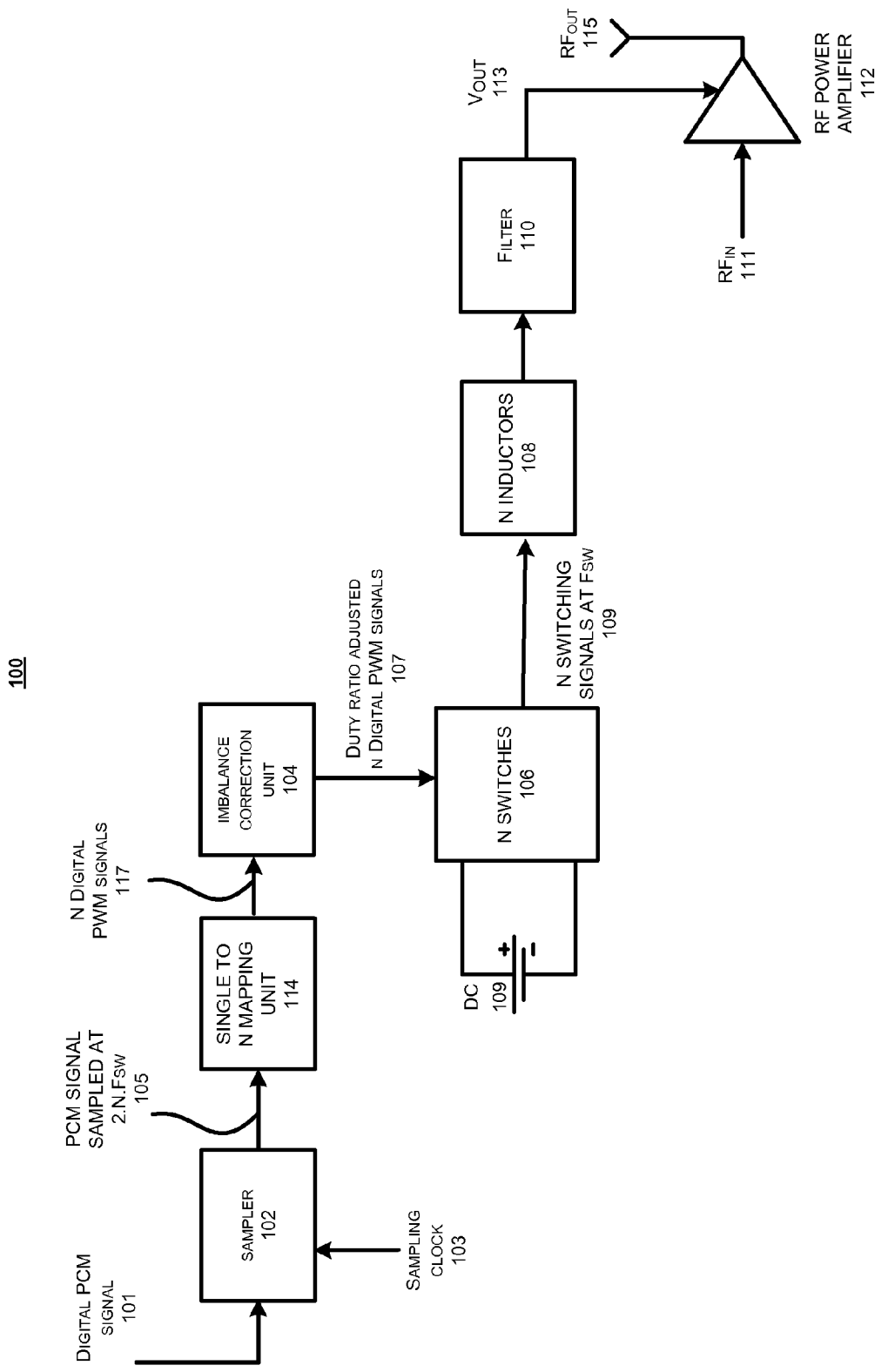
FIG. 1 illustrates a block diagram of the system where a Digital PCM Signal is used to produce an output voltage which powers an RF Power Amplifier according to embodiments of the present inventions.

FIG. 1 illustrates a block diagram of the system where a Digital PCM Signal 101 is used to produce an output voltage which defines the power output needed from an RF Power Amplifier 112. This power output from an RF Power Amplifier 112 tracks the Digital PCM Signal 101. A plurality of N switches 106 control a switching power stage for the RF Power Amplifier 112 containing N inductors 108 and a filter 110. For optimum efficiency and fidelity it is desired that each of the N switches 106, also known as stages, share the output current and power equally.

Sampler 102 can be used to sample the Digital PCM Signal 101 based on a Sampling Clock 103 and produces output Sampled Digital PCM Signal 105. The sampling frequency of the Sampler 102 is preferably at a sampling ratio of two times a number N of switches 106 times a switching frequency of the switches 106. Alternatively the sampler 102 is unneeded when the Digital PCM Signals 101 already is delivered at this sampling ratio.

Single to N mapping unit 114 takes PCM signal input sampled at $2 \cdot N \cdot F_{SW}$ and produces N digital PWM signals 117. Since each PWM signal has two transitions in a switching period the mapping unit switches only one of the N digital PWM signals at a time. The N digital PWM signals 117 are the input to the Imbalance correction unit 104. The switching of the Single to N mapping unit 114 switches to generate all the PWM signals at a same switching frequency $F_{SW}$. When N is 2 the mapping unit switches one signal transition in each one-quarter of the PCM signal input. When N is 3 the mapping unit switches one signal transition in each one-sixth of the PCM signal input. When N is 4 the mapping unit switches one signal transition in each one-eighth of the PCM signal input.

Imbalance Correction Unit 104 produces output Duty Ratio Adjusted N Digital PWM Signals 107 for the switches 106. The imbalance correction unit adjusts a duty ratio of the N digital PWM signals relative to one another based on differentially accumulating errors among the N digital PWM signals to prevent divergence of N digital PWM signals. The Imbalance Correction Unit 104 has an explicit control mechanism for substantially equal sharing of the currents among the inductors. The Imbalance Correction Unit 104 contains an accumulator that accumulates differences between the stages and forces equal sharing of current between the stages. The Imbalance Correction Unit 104 also helps cancel the switching frequency at the output of the system.

N Switches 106 have input Duty Ratio Adjusted Sampled Digital PWM Signals 107 and drive output Inductors 108 from a DC (direct current) source such as battery 109. The N switches are each coupled to a corresponding one of the N digital balanced PWM signals. Since the N switches are controlled by the N digitally balanced PWM signals, both the mapping unit and thus the switches switch only one the N digital PWM signal at a time.

The PCM signal input arrives or is generated at a sampling frequency which is relatively high. It is desirable to support a high sampling frequency while keeping the switching frequency of the N digital PWM signals $F_{SW}$ low.

The PCM signal input preferably arrives at the sampling frequency of the PCM signal input two times the integer number N times the switching frequency ($2 \times N \times F_{SW}$). The integer number N is the number of digital PWM signals generated therefrom by the mapping unit. The integer number N is also the number of switches. A sampler would sample the PCM signal input at a sampling frequency two times the integer number N times the switching frequency ($2 \times N \times F_{SW}$). The sampler could be used if the PCM signal input didn't arrive at the frequency of this sampling frequency.

The mapping unit thus switches each of the N digital PWM signals at the switching frequency that is the sampling frequency of the PCM signal input divided by a product of 2 times the integer number N. When N is 2 the mapping unit switches each of the 2 digital PWM signals at the switching frequency that is one-quarter of the sampling frequency of the PCM signal input. When N is 3 the mapping unit switches each of the 3 digital PWM signals at the switching frequency that is one-sixth of the sampling frequency of the PCM signal input. When N is 4 the mapping unit switches each of the 4 digital PWM signals at the switching frequency that is one-eighth of the sampling frequency of the PCM signal input.

A plurality of Inductors 108 are configured in parallel and each take input from a corresponding one of the plurality of N Switches 106. The N Inductors 108 preferably produce a single output that is filtered by Filter 110. The N inductances are in parallel, each of the N inductances coupled to a corresponding one of the N switches to produce a combined signal. Filter 110 is a low pass filter coupled to filter the combined signal and to remove out of band variants as will later be seen with reference to FIGS. 22-24 and FIG. 26. Filter 110 takes input from N Inductors 108 and produces output $V_{OUT}$ 113 which powers the RF Power Amplifier 112. RE Power Amplifier 112 has an input 111 and power supply $V_{OUT}$ 113 and produces output $RF_{OUT}$ 115.

This invention introduces a way of reducing the switching frequency without reducing the performance of the system. It introduces a multiple PWM system where there are two or more digital PWM signals that are generated from a single PCM (pulse control modulation) input. The PCM input is upsampled to the product of two times the switching frequency and the number of PWM signals using digital interpolation filters. By using digital cancellation the switching frequency and intermodulation of the switching frequency and the frequencies in the envelope signal are cancelled. The lowest undesired frequency produced is the switching frequency times the number of PWM signals and the intermodulation of this frequency and the frequencies in the envelope signal. These frequencies are quite high and can be easily filtered using physically small passive L-C low pass filters.

A pair of digital PWM signals has edges at four times the switching frequency. However, the edges of the two digital PWM signals cross each other depending on the duty ratio of the PWM. The inventions introduce a method to map the PCM samples at four times the switching frequency to rising and falling edges of a pair of PWM signals in manner that preserves the linearity of the output signals. Further, there is no frequency content at the switching frequency or intermodulation between the switching frequency and the frequencies in the envelope signal.

The dual PWM signals are amplified by dual power stages and filtered by a passive L-C filter which also combines the square waves to produce a single output which powers the RF power amplifier.

For triple and quad cases the signals are amplified by triple or quad power stages and filtered by a passive L-C filter which also combines the square waves to produce a single output which powers the RF power amplifier.

In digital PWM generation a high speed quantization clock for example, at 6 GHz is counted to generate the PWM signal. The duty ratios of the PWM signal are quantized such that the PWM signal edge coincides with an edge of the high speed clock. The pair of digital PWM signals drive a pair of power stages which are combined using two inductors.

For optimum efficiency and fidelity of the output signal it is desired that the stages share the output current equally. However, the PWM duty ratios of the multiple stages are driven by consecutive PCM signal values and further quantized for generation of the duty ratios. The current in the inductors are set by the integrals of the PWM voltages. Thus it is possible and even likely that over a number of PWM cycles the current in the multiple stages will diverge from each other. In this invention a method is introduced to share the current between the multiple stages without sensing the current which would be costly and cumbersome.

Figure 2:
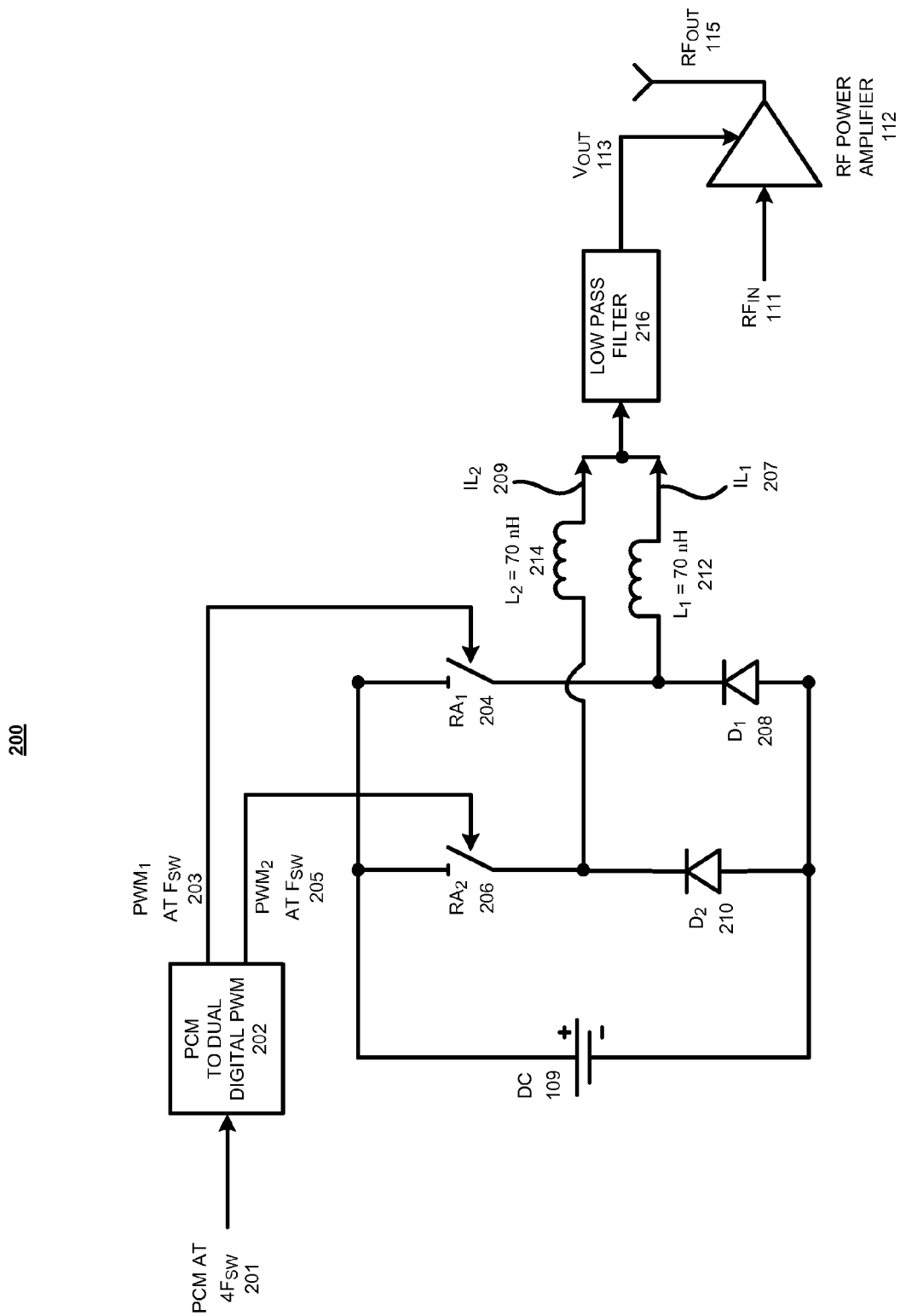
FIG. 2 illustrates a schematic block diagram of PCM to Dual Digital PWM driving a power stage which provides envelope tracking to an RF Power Amplifier according to a embodiments of the present inventions.

FIG. 2 illustrates a schematic block diagram of PCM to Dual Digital PWM driving a Power Stage which provides Envelope Tracking to an RE Power Amplifier according to embodiments. PCM to Dual Digital PWM 202 takes input from PCM at $4E_{SW}$ 201 and produces two output $PWM_1$ at $F_{SW}$ 203 and $PWM_2$ at $E_{SW}$ 205. $PWM_1$ at $F_{SW}$ 203 is the gating signal for switch $RA_1$ 204 and $PWM_2$ at $F_{SW}$ 205 is the gating signal for switch $RA_2$ 206. Switch $RA_1$ 204 and $RA_2$ 206 both connect to DC voltage source 109 and also connected to diodes $D_1$ 208 and $D_2$ 210. When the switches are off the diodes connect the switching node to ground. Inductors $L_1$ 212 and $L_2$ 214 both are connected to the same Low Pass Filter 216. The currents in the Inductors $L_1$ 212 and $L_2$ 214 are $IL_1$ 207 and $IL_2$ 209 respectively. Low Pass Filter produces output $V_{OUT}$ 113 which powers the RE Power Amplifier 112. RF Power Amplifier 112 has input $RF_{IN}$ 111 and produces output $RE_{OUT}$ 115.

Figure 3:
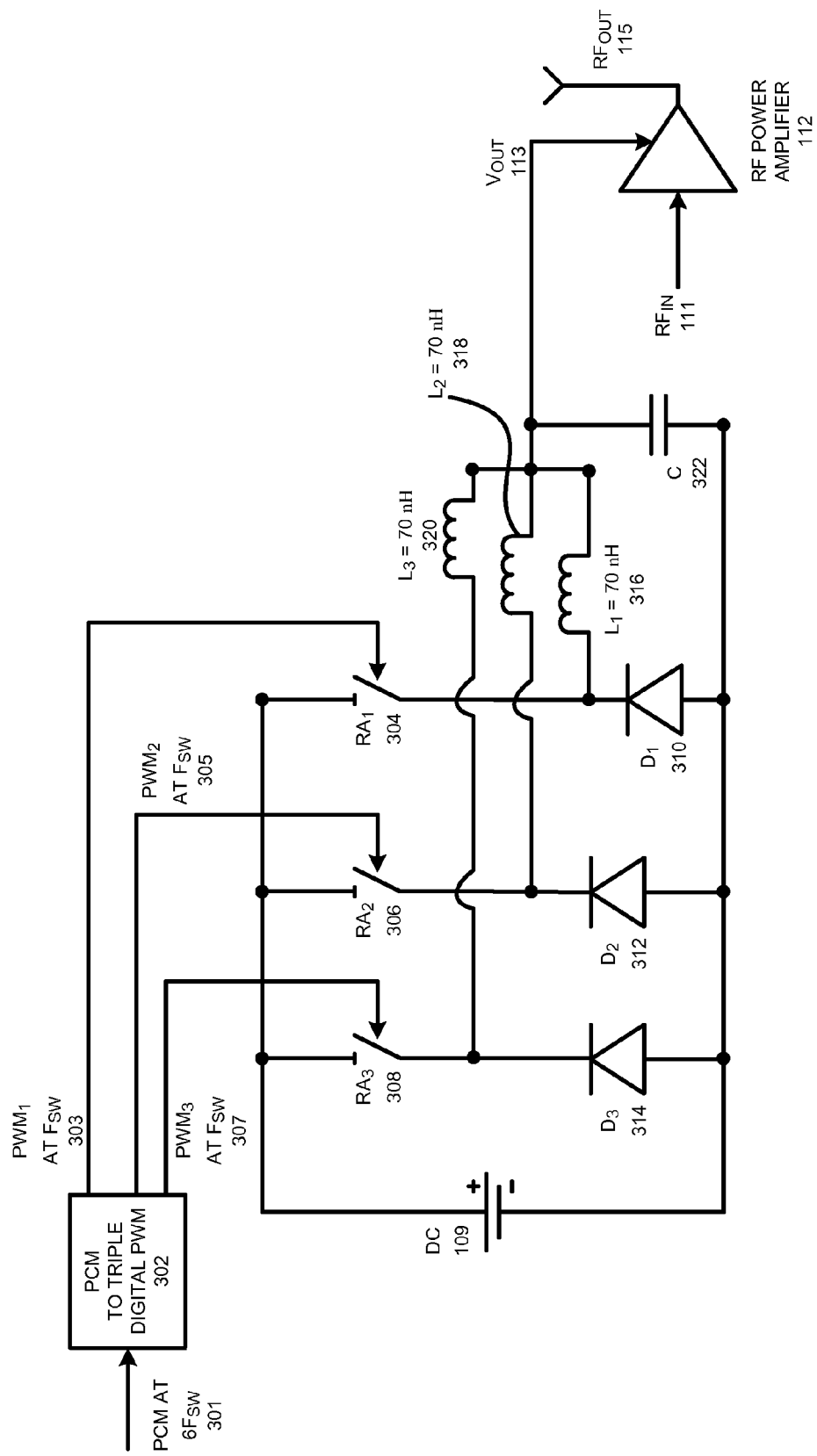
FIG. 3 illustrates a schematic block diagram of PCM to Triple Digital PWM driving a power stage which provides envelope tracking to an RF Power Amplifier according to a embodiments of the present inventions.

FIG. 3 illustrates a schematic block diagram of PCM to Triple Digital PWM driving a Power Stage which provides Envelope Tracking to an RE Power Amplifier according to embodiments. PCM to Triple Digital PWM 302 takes input from PCM at $6F_{SW}$ 301 and produces three output $PWM_1$ at $F_{SW}$ 303, $PWM_2$ at $F_{SW}$ 305 and $PWM_3$ at $F_{SW}$ 307. $PWM_1$ at $F_{SW}$ 303 is the gating signal for switch $RA_1$ 304, $PWM_2$ at $F_{SW}$ 305 is the gating signal for switch $RA_2$ 306 and $PWM_3$ $F_{SW}$ 307 is the gating signal for switch $RA_3$ 308. Switch $RA_1$ 304, $RA_2$ 306 and $RA_3$ 308 are connect to DC voltage source 109 and also connected to diodes $D_1$ 310, $D_2$ 312 and $D_3$ 314. When the switches are off the diodes connect the switching node to ground. Inductors $L_1$ 316, $L_2$ 318 and $L_3$ 320 are connected to the same $V_{OUT}$ 113 and capacitor C 322. $V_{OUT}$ 113 which powers the RF Power Amplifier 112. RE Power Amplifier 112 has input $RF_N$ 111 and produces output $RF_{OUT}$ 115.

Figure 4:
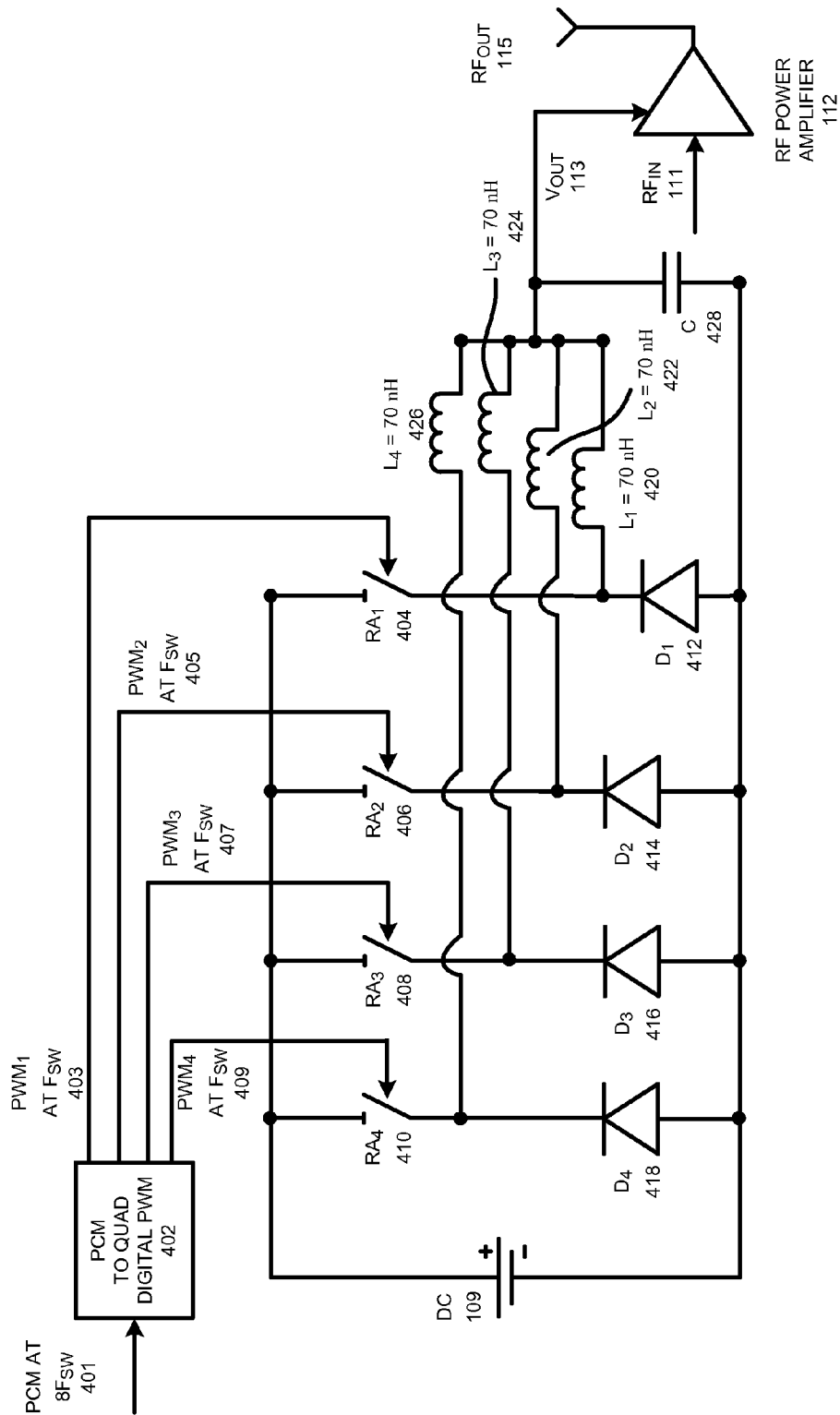
FIG. 4 illustrates a schematic block diagram of PCM to Quad Digital PWM driving a power stage which provides envelope tracking to an RF Power Amplifier according to embodiments of the present inventions.

FIG. 4 illustrates a schematic block diagram of PCM to Quad Digital PWM driving a Power Stage which provides Envelope Tracking to an RF Power Amplifier according to embodiments. PCM to Quad Digital PWM 402 takes input from PCM at $8F_{SW}$ 401 and produces four output $PWM_1$ at $F_{SW}$ 403, $PWM_2$ at $F_{SW}$ 405, $PWM_3$ at $F_{SW}$ 407 and $PWM_4$ at $F_{SW}$ 409 $PWM_1$ at $F_{SW}$ 403 is the gating signal for switch $RA_1$ 404, $PWM_2$ at $F_{SW}$ 405 is the gating signal for switch $RA_2$ 406, $PWM_3$ at $F_{SW}$ 407 is the gating signal for switch $RA_3$ 408 and $PWM_4$ at $F_{SW}$ 409 is the gating signal for switch $RA_4$ 410. Switch $RA_1$ 404, $RA_2$ 406, $RA_3$ 408 and $RA_4$ 410 are connect to DC voltage source 109 and also connected to diodes $D_1$ 412, $D_2$ 414, $D_3$ 416 and $D_4$ 418. When the switches are off the diodes connect the switching node to ground. Inductors $L_1$ 420, $L_2$ 422, $L_3$ 424 and $L_4$ 426 are connected to the same $V_{OUT}$ 113 and capacitor C 428. $V_{OUT}$ 113 which powers the RF Power Amplifier 112. RE Power Amplifier 112 has input $RF_N$ 111 and produces output $RF_{OUT}$ 115.

Figure 5:
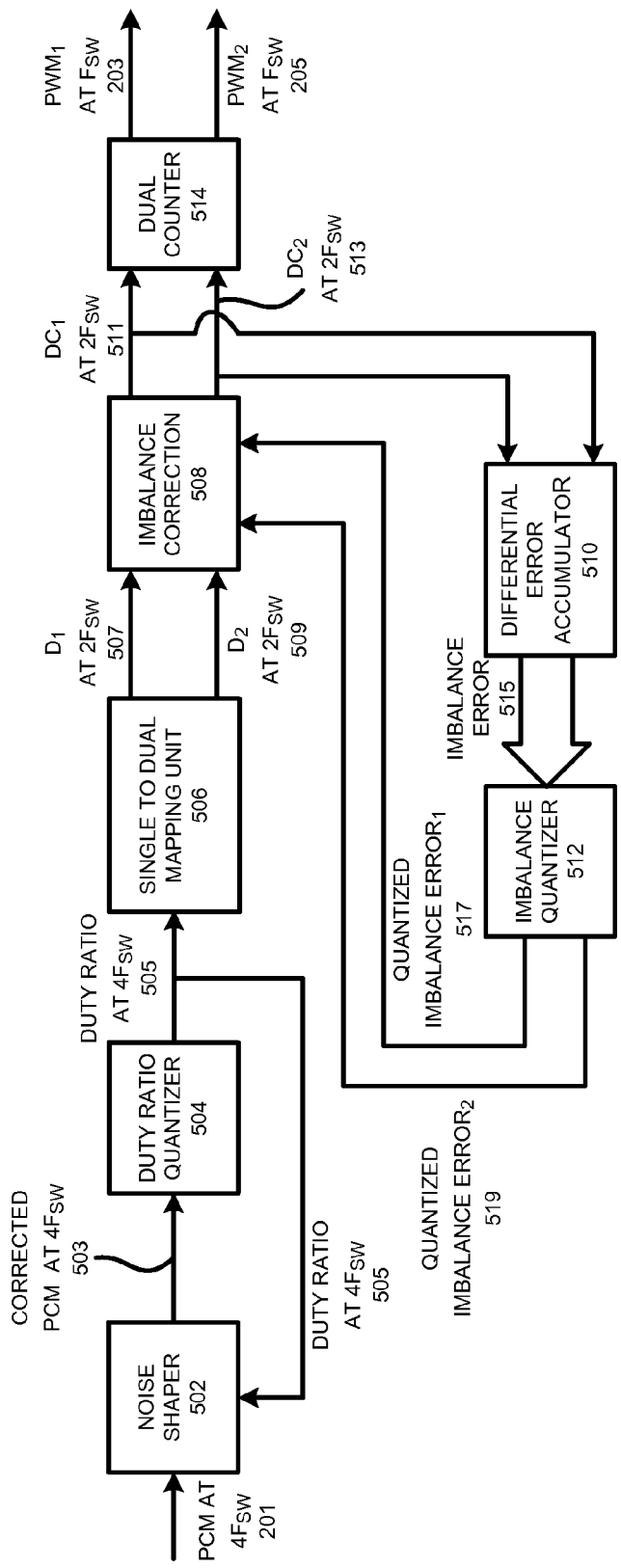
FIG. 5 illustrates a Block Diagram of PCM to Dual Digital PWM for Envelope Tracking according to embodiments of the present inventions.

FIG. 5 illustrates a Block Diagram of PCM to Dual Digital PWM for Envelope Tracking 500 according to embodiments. Noise Shaper 502 takes input from PCM at $4F_{SW}$ 201 and produces output Corrected PCM at $4F_{SW}$ 503. Duty Ratio Quantizer 504 takes input from Corrected PCM at $4F_{SW}$ 503 and produces output Duty Ratio at $4F_{SW}$ 505. Single to Dual Mapping Unit 506 takes input from Duty Ratio at $4F_{SW}$ 505 and produces two outputs $D_1$ at $2F_{SW}$ 507 and $D_2$ at $2F_{SW}$ 509. Imbalance Correction 508 takes two inputs from $D_1$ at $2F_{SW}$ 507 and $D_2$ at $2F_{SW}$ 509 and produces two corrected outputs $DC_1$ at $2F_{SW}$ 511 and $DC_2$ at $2F_{SW}$ 513. Differential Error Accumulator 510 takes two input from $DC_1$ at $2F_{SW}$ 511 and $DC_2$ at $2F_{SW}$ 513 and produces output Imbalance Error 515. Imbalance Quantizer 512 takes input from Imbalance Error 515 and produces two outputs Quantized Imbalance $Error_1$ 517 and Quantized Imbalance $Error_2$ 519. The Quantized Imbalance $Error_1$ 517 and Quantized Imbalance $Error_2$ 519 are added to the $D_1$ at $2F_{SW}$ 507 and $D_2$ at $2F_{SW}$ 509 to produce $2F_{SW}$ 511 and $DC_2$ at $2F_{SW}$ 513. Dual Counter 514 takes two inputs from $DC_1$ at $2F_{SW}$ 511 and $DC_2$ at $2F_{SW}$ 513 and produces two output $PWM_1$ at $F_{SW}$ 203 and $PWM_2$ at $F_{SW}$ 205. PWM1 at FSW 203 and PWM2 at FSW 205 when applied to a dual power stage produce a combined output signal that is proportional to PCM at 4FSW 201.

Figure 6:
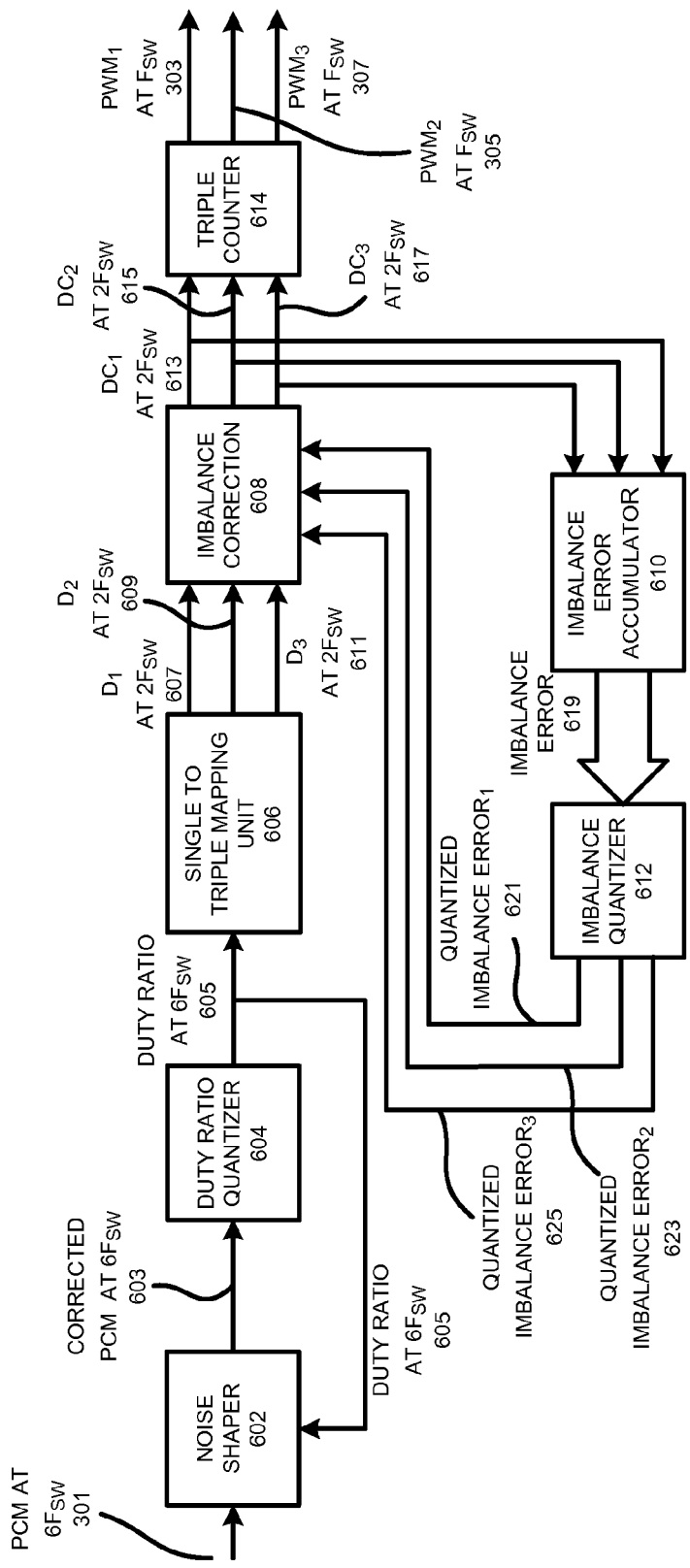
FIG. 6 illustrates a Block Diagram of PCM to Triple Digital PWM for Envelope Tracking according to embodiments of the present inventions.

FIG. 6 illustrates a Block Diagram of PCM to Triple Digital PWM for Envelope Tracking 600 according to embodiments. Noise Shaper 602 takes input from PCM at $6F_{SW}$ 301 and produces output Corrected PCM at $6F_{SW}$ 603. Duty Ratio Quantizer 604 takes input from Corrected PCM at $6F_{SW}$ 603 and produces output Duty Ratio at $6F_{SW}$ 605. Duty Ratio at $6F_{SW}$ 605 is input to Single to Triple Mapping Unit 606. Single to Triple Mapping Unit 606 takes input from Duty Ratio at $6F_{SW}$ 605 and produces three outputs $D_1$ at $2F_{SW}$ 607, $D_2$ at $2F_{SW}$ 609 and $D_3$ at $2F_{SW}$ 611. $D_1$ at $2F_{SW}$ 607, $D_2$ at $2F_{SW}$ 609 and $D_3$ at $2F_{SW}$ 611 are takes input from Single to Triple Mapping Unit 606 and produces output Imbalance Correction 608. Imbalance Correction 608 takes two input from $D_1$ at $2F_{SW}$ 607, $D_2$ at $2F_{SW}$ 609 and $D_3$ at $2F_{SW}$ 611 and produces three outputs corrected duty ratios $DC_1$ at $2F_{SW}$ 613, $DC_2$ at $2F_{SW}$ 615 and $DC_3$ at $2F_{SW}$ 617. $DC_1$ at $2F_{SW}$ 613, $DC_2$ at $2F_{SW}$ 615 and $DC_3$ at $2F_{SW}$ 617 are takes input from Imbalance Correction 608 and produces output Triple Counter 614. Imbalance Error Accumulator 610 takes three input from $DC_1$ at $2F_{SW}$ 613, $DC_2$ at $2F_{SW}$ 615 and $DC_3$ at $2F_{SW}$ 617 and produces output Imbalance Error 619. Imbalance Error 619 takes input from Imbalance Error Accumulator 610 and produces output Imbalance Quantizer 612. Imbalance Quantizer 612 takes input from Imbalance Error 619 and produce three outputs Quantized Imbalance $Error_1$ 621, Quantized Imbalance $Error_2$ 623 and Quantized Imbalance $Error_3$ 625. Quantized Imbalance $Error_1$ 621, Quantized Imbalance $Error_2$ 623 and Quantized Imbalance $Error_3$ 625 takes input from Imbalance Quantizer 612 and going to Imbalance Correction 608. Triple Counter 614 takes three input from $DC_1$ at $2F_{SW}$ 613, $DC_2$ at $2F_{SW}$ 615 and $DC_3$ at $2F_{SW}$ 617 and produces three output $PWM_1$ at $F_{SW}$ 303, $PWM_2$ at $F_{SW}$ 305 and $PWM_3$ at $F_{SW}$ 307.

Figure 7:
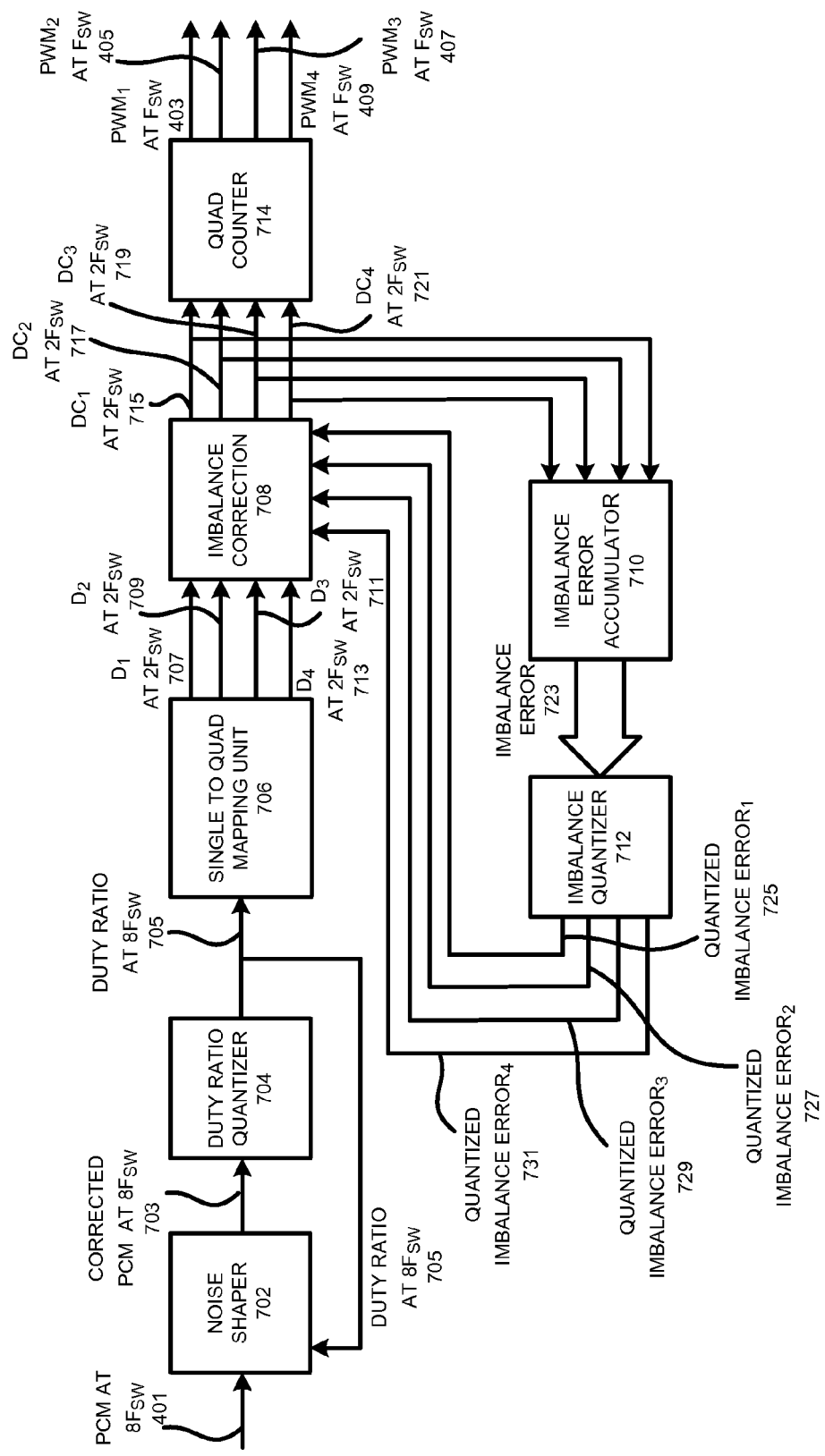
FIG. 7 illustrates a Block Diagram of PCM to Quad Digital PWM for Envelope Tracking according to embodiments of the present inventions.

FIG. 7 illustrates a Block Diagram of PCM to Quad Digital PWM for Envelope Tracking 700 according to embodiments. Noise Shaper 702 takes input from PCM at $8F_{SW}$ 401 and produces output Corrected PCM at $8F_{SW}$ 703. Duty Ratio Quantizer 704 takes input from Corrected PCM at $8F_{SW}$ 703 and produces output Duty Ratio at $8F_{SW}$ 705. Single to Quad Mapping Unit 706 takes input from Duty Ratio at $8F_{SW}$ 705 and produces four outputs $D_1$ at $2F_{SW}$ 707, $D_2$ at $2F_{SW}$ 709, $D_3$ at $2F_{SW}$ 711 and $D_4$ at $2F_{SW}$ 713. Imbalance Correction 708 takes inputs from $D_1$ at $2F_{SW}$ 707, $D_2$ at $2F_{SW}$ 709, $D_3$ at $2F_{SW}$ 711 and $D_4$ at $2F_{SW}$ 713 and produce four outputs $DC_1$ at $2F_{SW}$ 715, $DC_2$ at $2F_{SW}$ 717, $DC_3$ at $2F_{SW}$ 719 and $DC_4$ at $2F_{SW}$ 721. Imbalance Error Accumulator 710 takes four inputs from $DC_1$ at $2F_{SW}$ 715, $DC_2$ at $2F_{SW}$ 717, $DC_3$ at $2F_{SW}$ 719 and $DC_4$ at $2F_{SW}$ 721 and produces output Imbalance Error 723. Imbalance Quantizer 712 takes input from Imbalance Error 723 and produces four outputs Quantized Imbalance $Error_1$ 725, Quantized Imbalance $Error_2$ 727, Quantized Imbalance $Error_3$ 729 and Quantized Imbalance $Error_4$ 731. Imbalance Error$_1$ 725, Quantized Imbalance Error$_2$ 727, Quantized Imbalance Error$_3$ 729 and Quantized Imbalance Error$_4$ 731 takes input from Imbalance Quantizer 712 and going to Quad Counter 714. Quad Counter 714 takes four input from DC$_1$ at 2F$_{SW}$ 715, DC$_2$ at 2F$_{SW}$ 717, DC$_3$ at 2F$_{SW}$ 719 and DC$_4$ at 2F$_{SW}$ 721 and produces four outputs PWM$_1$ at F$_{SW}$ 403, PWM$_2$ at F$_{SW}$ 405, PWM$_3$ at F$_{SW}$ 407 and PWM$_4$ at F$_{SW}$ 409.

Figure 8:
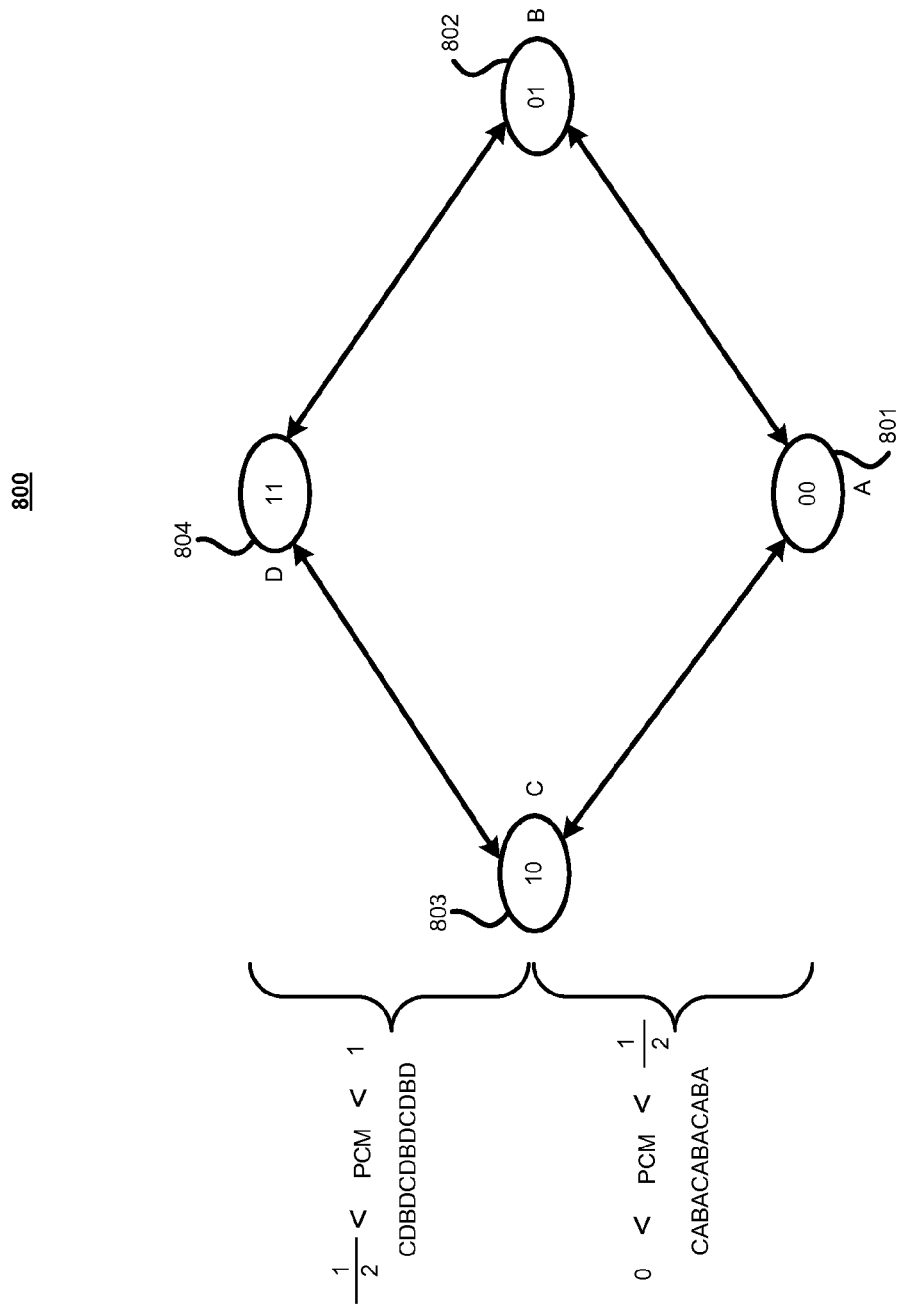
FIG. 8 illustrates a State Space diagram of the Dual Digital PWM according to embodiments of the present inventions.

FIG. 8 illustrates a State Space diagram of the Dual Digital PWM. There are four possible states: A 801 which corresponds to PWM$_1$ and PWM$_2$ equal to 00, B 802 which corresponds to PWM$_1$ and PWM$_2$ equal to 01, C 803 which corresponds to PWM$_1$ and PWM$_2$ equal to 10, D 804 which corresponds to PWM$_1$ and PWM$_2$ equal to 11.

When 0<PCM<1/2 the transitions follow the pattern CABACABACABA.

When 1/2<PCM<1 the transitions follow the pattern CDBDCDBDCDBD. The objectives of the State Space diagram are to generate PWM signals that maintain a fixed switching frequency F$_{SW}$ over all possible duty ratios, while cancelling the switching frequency at the output voltage at the output of the switcher. Another objective of the system is to map a PCM signal sampled at four times the switching frequency to the pair of PWM signals. The system starts at state C or 10 at the beginning of the PWM cycle. Depending on the level of the PCM input the system goes to state A 00 or D 11. Independent of the PCM level the next state is state B 01. From state B 01 the system goes to A 00 or D 11 depending on the level of the PCM. The next state from this is state C 10 which completes the PWM cycle. Depending on the level of PCM being greater than or less than half the system follows the two switching patterns.

The delay times are related to the PCM input in a linear fashion. This is also called Uniform Sampling. Uniform sampling has a residual nonlinearity. However, this invention has high linearity with Uniform Sampling because of the high sample rate. Uniform Sampling also eliminates any additional computation related to linearization which is also desirable. In FIG. 8 the relationship between the times and the PCM values are given by the Table 1 Dual PWM Truth Table. They have also been summarized by the following equations.

$$dt_{11} = T_{SW} PCM_{11}/2$$

$$dt_{12} = T_{SW}(1 - 2PCM_{12})/4$$

$$dt_{13} = T_{SW} PCM_{13}/2$$

$$dt_{14} = T_{SW}(1 - 2PCM_{14})/4$$

$$dt_{21} = T_{SW} PCM_{21}/2$$

$$dt_{22} = T_{SW}(1 - 2PCM_{22})/4$$

$$dt_{23} = T_{SW}(1 - PCM_{23})/2$$

$$dt_{24} = T_{SW}(2PCM_{24} - 1)/4$$

$$dt_{31} = T_{SW}(1 - PCM_{31})/2$$

$$dt_{32} = T_{SW}(2PCM_{32} - 1)/4$$

$$dt_{33} = T_{SW}(1 - PCM_{33})/2$$

$$dt_{34} = T_{SW}(2PCM_{34} - 1)/4$$

The relationship between the PCM value and the PWM transition times is formally given by the truth table given below.

TABLE 1

Dual PWM Truth Table

| Q | PCM value | PWM$_1$ at start | PWM$_2$ at start | Start state | PWM$_1$ at end | PWM$_2$ at end | End state | Signal change | Signal Change time |
|---|---|---|---|---|---|---|---|---|---|
| Q$_1$ | <0.5 | 1 | 0 | C | 0 | 0 | A | PWM$_1$ | (2pcm)Tsw/4 |
|  | >0.5 | 1 | 0 | C | 1 | 1 | D | PWM$_2$ | (2-2pcm)Tsw/4 |
| Q$_2$ | x | 0 | 0 | A | 0 | 1 | B | PWM$_2$ | (1-2pcm)Tsw/4 |
|  |  | 1 | 1 | D | 0 | 1 | B | PWM$_1$ | (2pcm-1)Tsw/4 |
| Q$_3$ | <0.5 | 0 | 1 | B | 0 | 0 | A | PWM$_2$ | (2pcm)Tsw/4 |
|  | >0.5 | 0 | 1 | B | 1 | 1 | D | PWM$_1$ | (2-2pcm)Tsw/4 |
| Q$_4$ | x | 0 | 0 | A | 1 | 0 | C | PWM$_1$ | (1-2pcm)Tsw/4 |
|  |  | 1 | 1 | D | 1 | 0 | C | PWM$_2$ | (2pcm-1)Tsw/4 |

Figure 9:
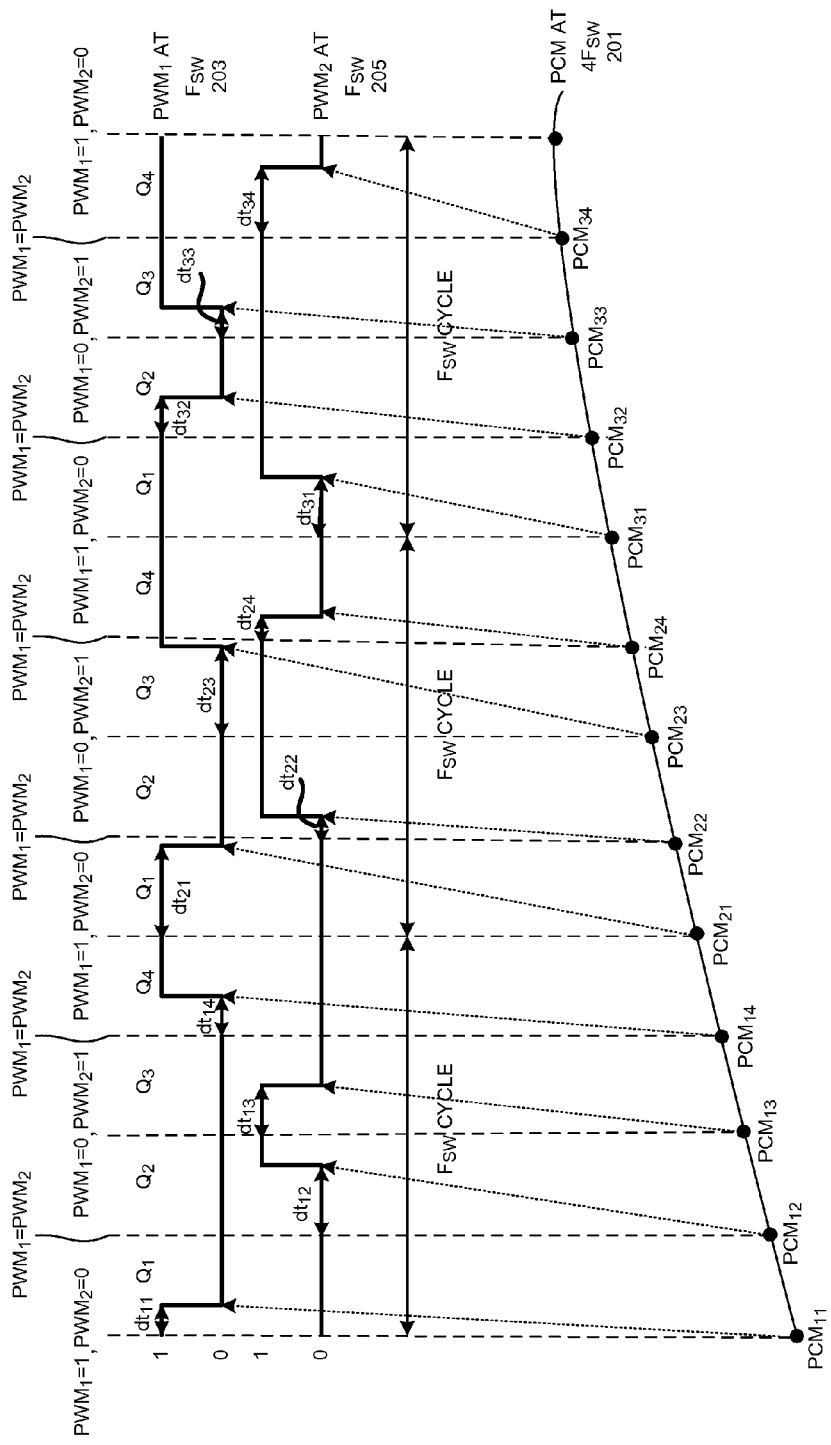
FIG. 9 illustrates a Timing Waveform of PCM to Dual Digital PWM for Envelope Tracking according to embodiments of the present inventions.

FIG. 9 illustrates a Timing diagram of the system. The PCM signal sampled at four times the switching frequency is mapped to four edges of the pair of PWM signals. As the duty ratio changes the PWM edges that map to the PCM samples change but the mapping works for the entire range of duty ratios. Even though the PWM signals vary vastly based on the level of the PCM signal in every PWM cycle there exists two points where PWM$_1$ equals PWM$_2$. Further, there is one point in each PWM cycle where PWM$_1$=1 and PWM$_2$=0. Conversely there is another point in the PWM cycle where PWM$_1$=0 and PWM$_2$=1. In each quarter of the PWM cycle there is exactly one edge of one the two PWM signals but which PWM signal is dependent on the level of the PCM signal. For low PCM values, during first quarter Q$_1$ the first PCM sample of the cycle maps to PWM$_1$ going down from 1 to 0 while PWM$_2$ stays at 0. For high PCM values, during first quarter Q$_1$ the first PCM sample of the cycle maps to PWM$_2$ going from 0 to 1 while PWM$_1$ stays at 1. Thus the mapping of the PCM signal to PWM$_1$ or PWM$_2$ and rising or falling edge are variable depending on the level of the PCM signal.

Figure 10:
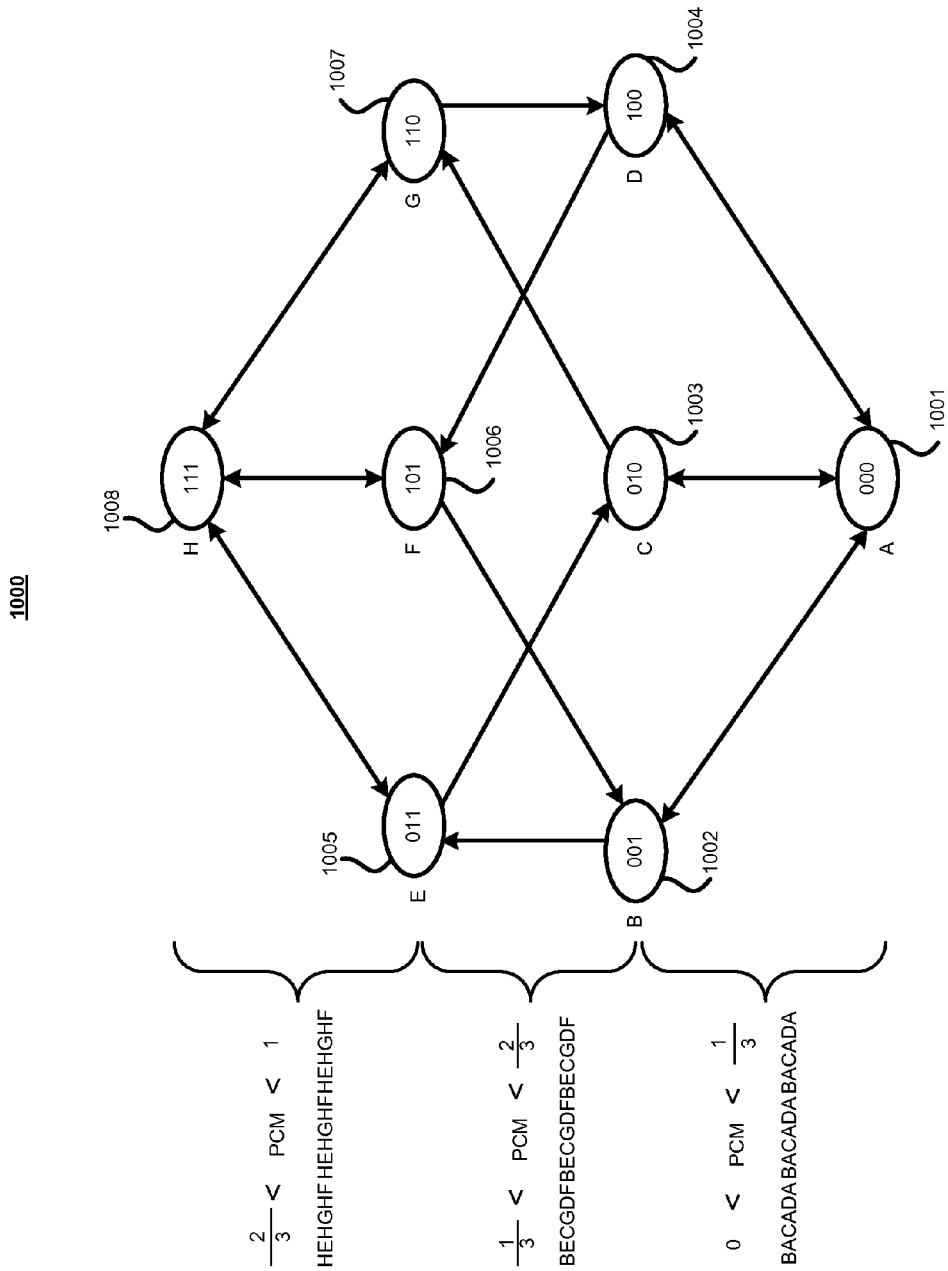
FIG. 10 illustrates a State Space diagram of the Triple Digital PWM according to embodiments of the present inventions.

FIG. 10 illustrates a State Space diagram of the Triple Digital PWM. There are eight possible states 1001 A 000, 1002 B 001, 1003 C 010, 1004 D 100, 1005 E 011, 1006 F 101, 1007 G 110 and 1008 H 111 for PWM$_1$, PWM$_2$ and PWM$_3$ respectively.

When 0<PCM<1/3 the transitions follow the pattern:
BACADABACADABACADA.

When 1/3<PCM<2/3 the transitions follow the pattern:
BECGDFBECGDFBECGDF.

When 2/3<PCM<1 the transitions follow the pattern:
HEHGHFHEHGHFHEHGHF.

The objectives of the State Space diagram is to generate PWM signals that maintain a fixed switching frequency F$_{SW}$ over all possible duty ratios, cancel the switching frequency at the output voltage at the output of the switcher. Another objective of the system is to map a PCM signal sampled at six times the switching frequency to the three PWM signals. Depending on the level of PCM being between zero and a third, between a third and two third, between two third and one the system follows one of the three switching patterns.

The PCM signal being band limited is typically smooth and transitions are between adjacent regions. The switching patterns in adjacent regions are chosen to have every other state being equal to allow easy transition between the three switching patterns if PCM crosses the one third or the two third value.

Figure 11:
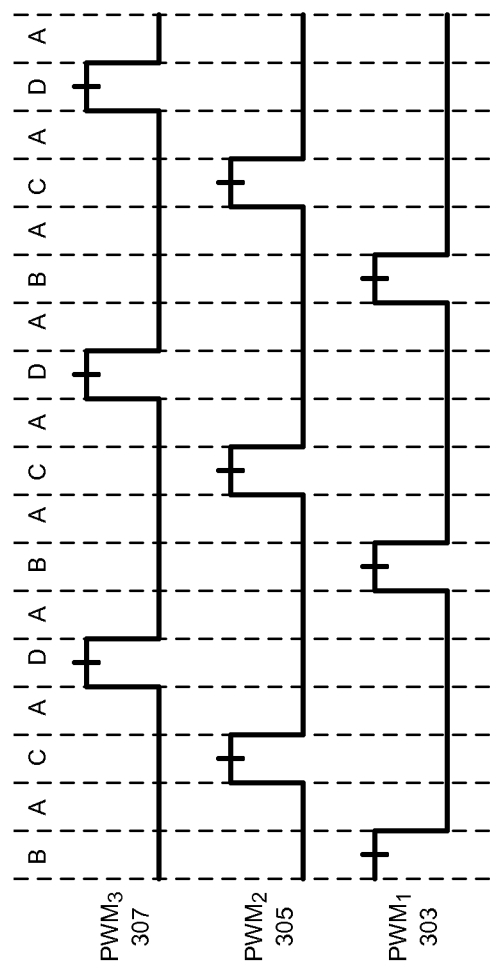
FIG. 11 illustrates a Timing Waveform of PCM to Triple Digital PWM for Envelope Tracking for the case that the PCM is limited between zero and one third according to embodiments of the present inventions.

FIG. 11 illustrates a Timing Waveform of PCM to Triple Digital PWM for Envelope Tracking for the case that the PCM is limited between zero and one third.

Figure 12:
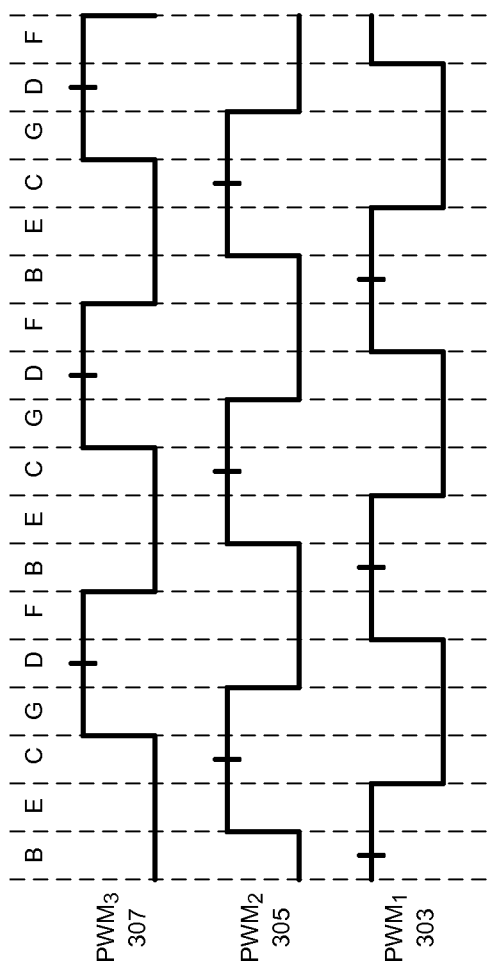
FIG. 12 illustrates a Timing Waveform of PCM to Triple Digital PWM for Envelope Tracking for the case that the PCM is limited between one third and two third according to embodiments of the present inventions.

FIG. 12 illustrates a Timing Waveform of PCM to Triple Digital PWM for Envelope Tracking for the case that the PCM is limited between one third and two third.

Figure 13:
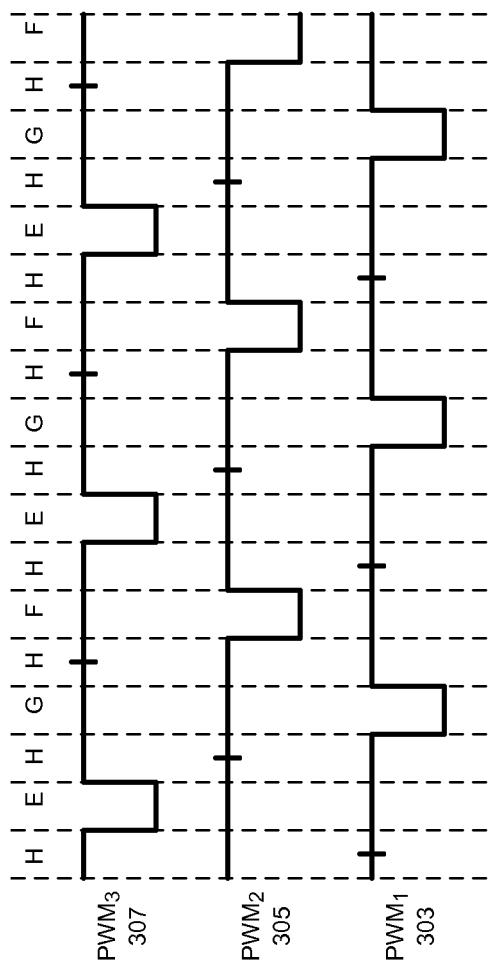
FIG. 13 illustrates a Timing Waveform of PCM to Triple Digital PWM for Envelope Tracking for the case that the PCM is limited between two third and one according to embodiments of the present inventions.

FIG. 13 illustrates a Timing Waveform of PCM to Triple Digital PWM for Envelope Tracking for the case that the PCM is limited between two third and one.

Figure 14:
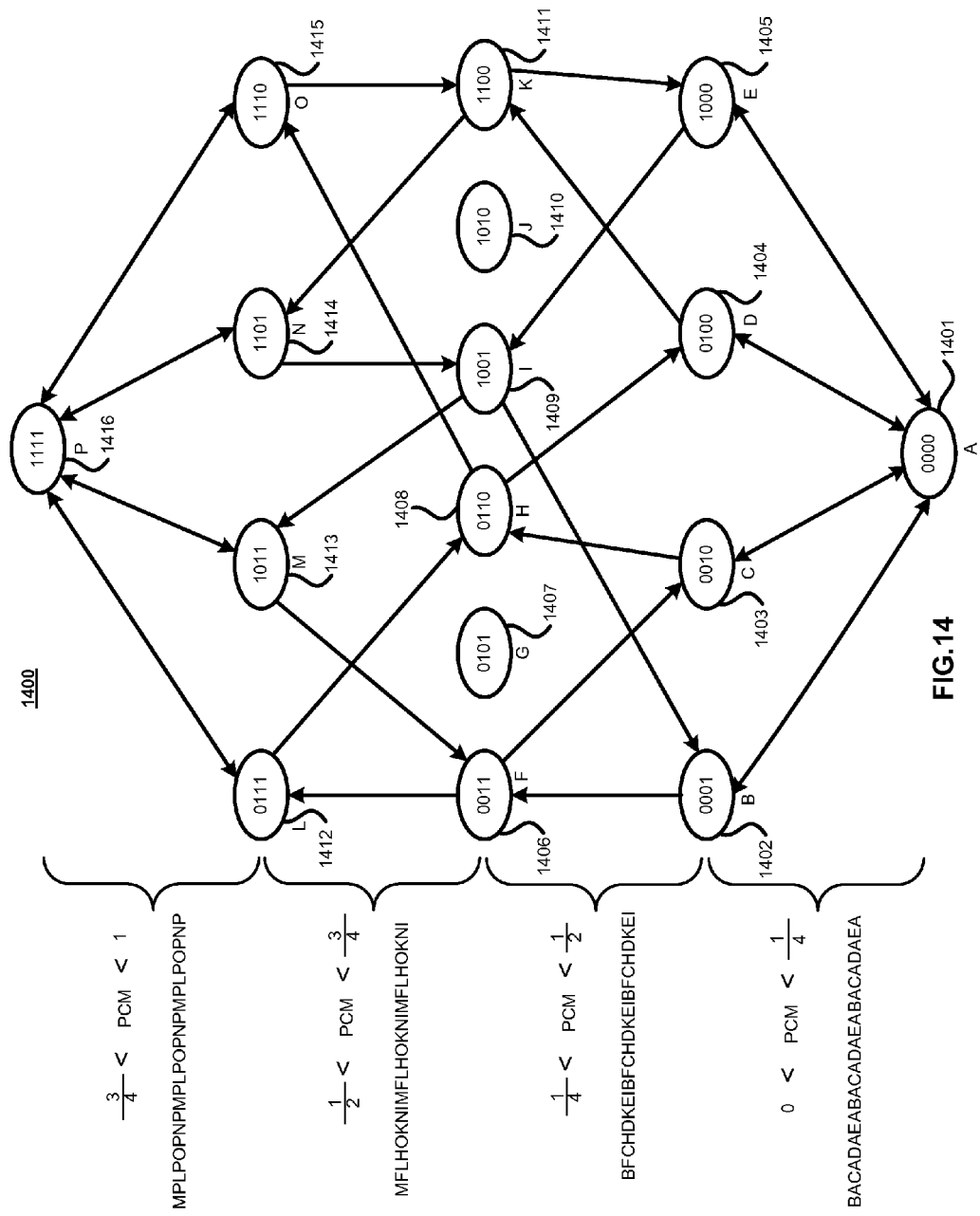
FIG. 14 illustrates a State Space diagram of the Quad Digital PWM according to embodiments of the present inventions.

FIG. 14 illustrates a State Space diagram of the Quad Digital PWM. There are 16 possible sates for the four PWM signals. The states are 1401 A 0000, 1402 B 0001, 1403 C 0010, 1404 D 0100, 1405 E 1000, 1406 F 0011, 1407 G 0101, 1408 H 0110, 1409 I 1001, 1410 J 1010, 1411K 1100, 1412 L 0111, 1413 M 1011, 1414 N 1101, 1415 O 1110 and 1418 P 1111. Of these states in one embodiment states G and J are avoided.

When 0<PCM<1/4 the transitions follow the pattern:
BACADAEABACADAEABACADAEA.
When 1/4<PCM<1/2 the transitions follow the pattern:
BFCHDKEIBFCHDKEIBFCHDKEI.
When 1/2<PCM<3/4 the transitions follow the pattern:
MFLHOKNIMFLHOKNIMFLHOKNI.
When 3/4<PCM<1 the transitions follow the pattern:
MPLPOPNPMPLPOPNPMPLPOPNP.

The objectives of the State Space diagram are to generate PWM signals that maintain a fixed switching frequency $F_{SW}$ over all possible duty ratios, while cancelling the switching frequency at the output voltage at the output of the switcher. Another objective of the system is to map a PCM signal sampled at eight times the switching frequency to the four PWM signals. Depending on the level of PCM being between zero and a fourth, between a fourth and half, between half and three quarter, between three quarter and one the system follows one of the four switching patterns. The PCM signal being band limited is typically smooth and transitions are between adjacent regions. The switching patterns in adjacent regions are chosen such that every other state is equal to allow an easy transition between the four switching patterns if PCM crosses the fourth, half or the three quarter value.

FIGS. 8, 10 and 14 show the state space diagrams for the 2, 3 and 4 digital PWM signals respectively. In general, the mapping unit switches the N digital PWM signals in the integer number N of transitions between N plus 1 layers of $2^N$ states. Further, the switching of the mapping unit is limited to switching between only those state combinations of the N digital PWM signals such that the switching frequency is cancelled in the combined signal from the N inductances. Also the mapping unit switches signal transitions in like patterns with common states.

In the switching of the mapping unit, the transitions alternate between layers. In the switching of the mapping unit, every other transition returns to an adjacent state on a same layer within one of N ranges of values of the N digital PCM signals.

Figure 15:
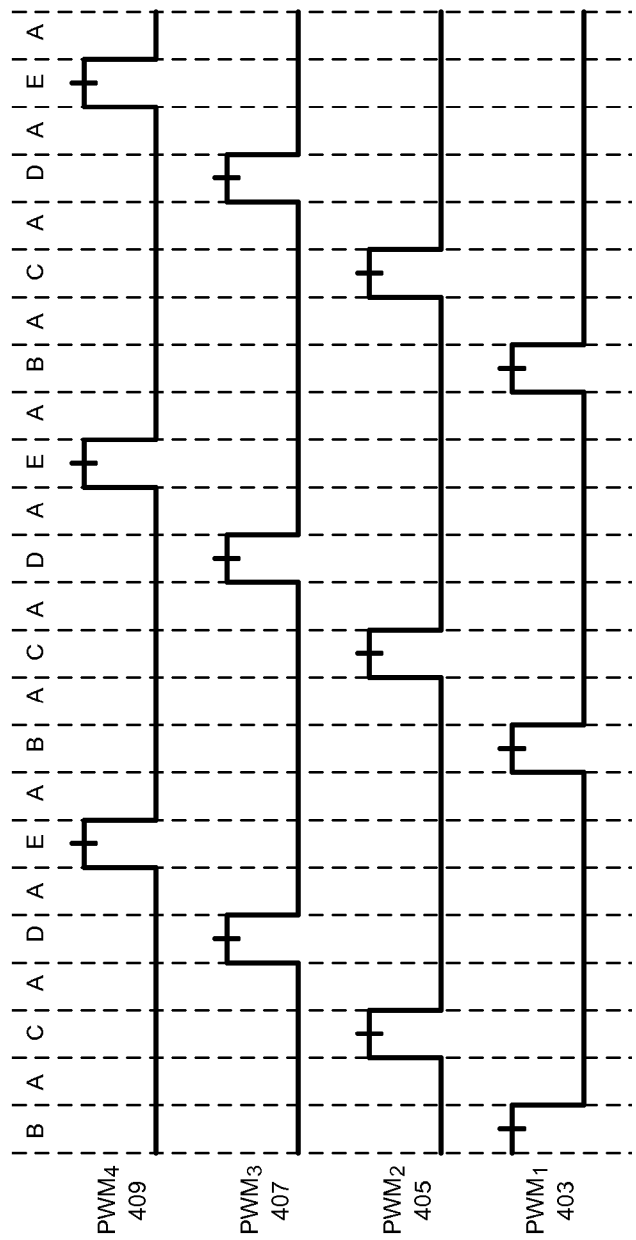
FIG. 15 illustrates a Timing Waveform of PCM to Quad Digital PWM for Envelope Tracking for the case that the PCM is limited between zero and one fourth according to embodiments of the present inventions.

FIG. 15 illustrates a Timing Waveform of PCM to Quad Digital PWM for Envelope Tracking for the case that the PCM is limited between zero and one fourth.

Figure 16:
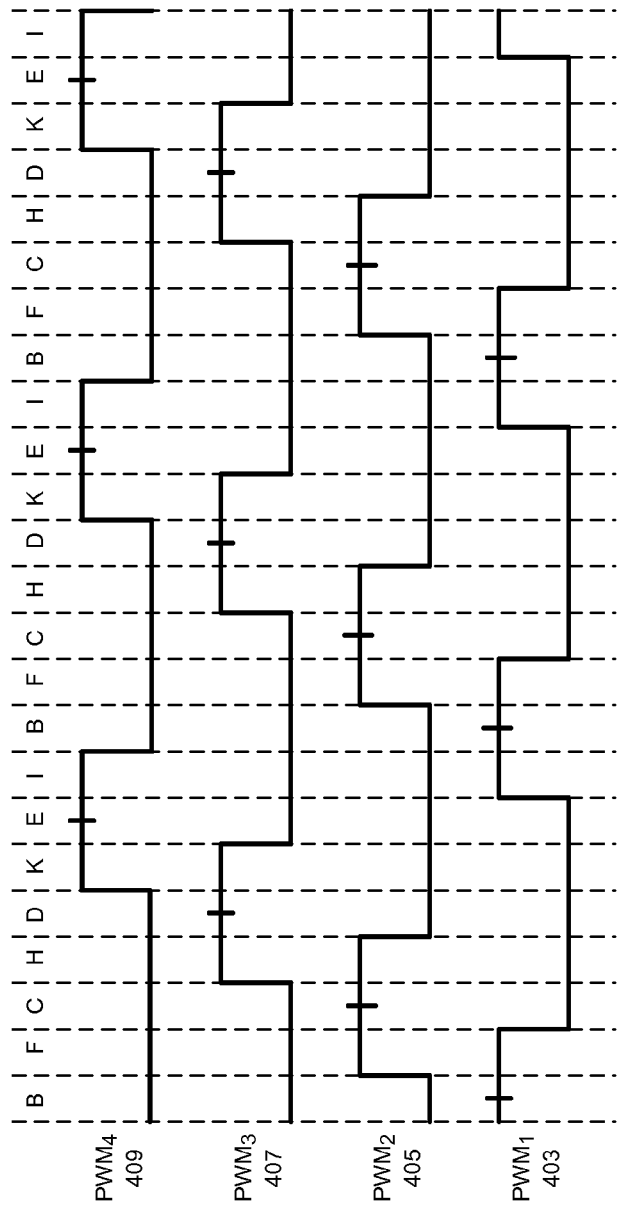
FIG. 16 illustrates a Timing Waveform of PCM to Triple Digital PWM for Envelope Tracking for the case that the PCM is limited between one fourth and half according to embodiments of the present inventions.

FIG. 16 illustrates a Timing Waveform of PCM to Triple Digital PWM for Envelope Tracking for the case that the PCM is limited between one fourth and half.

Figure 17:
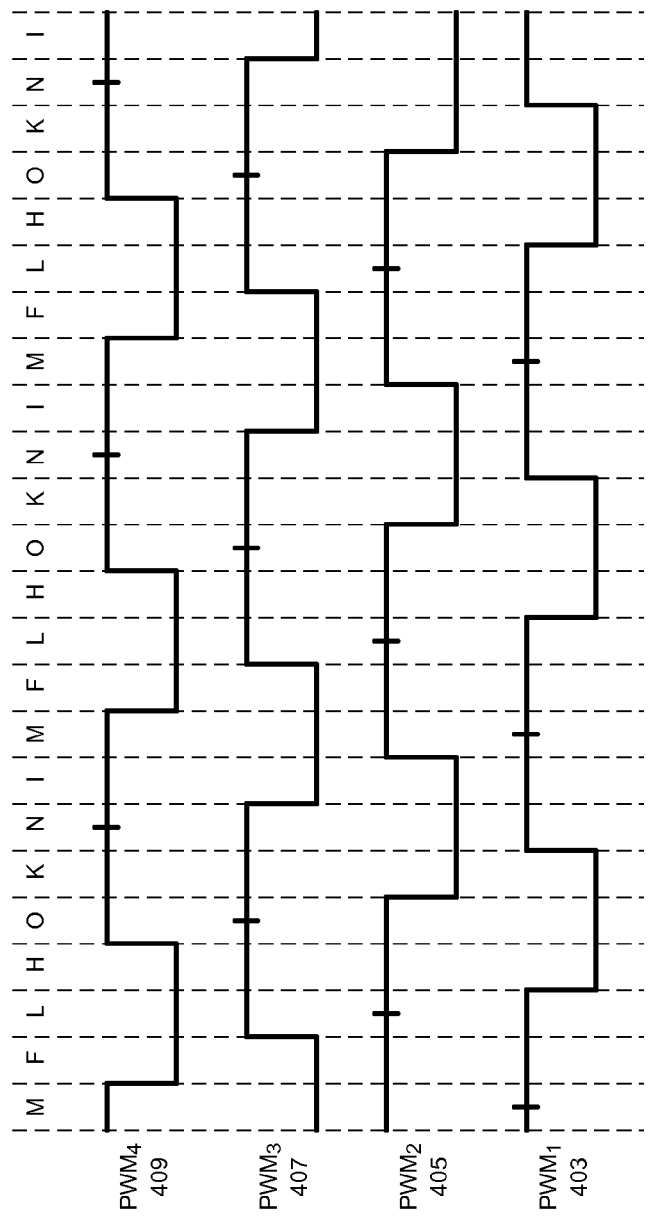
FIG. 17 illustrates a Timing Waveform of PCM to Quad Digital PWM for Envelope Tracking for the case that the PCM is limited between half and three fourth according to embodiments of the present inventions.

FIG. 17 illustrates a Timing Waveform of PCM to Quad Digital PWM for Envelope Tracking for the case that the PCM is limited between half and three fourth.

Figure 18:
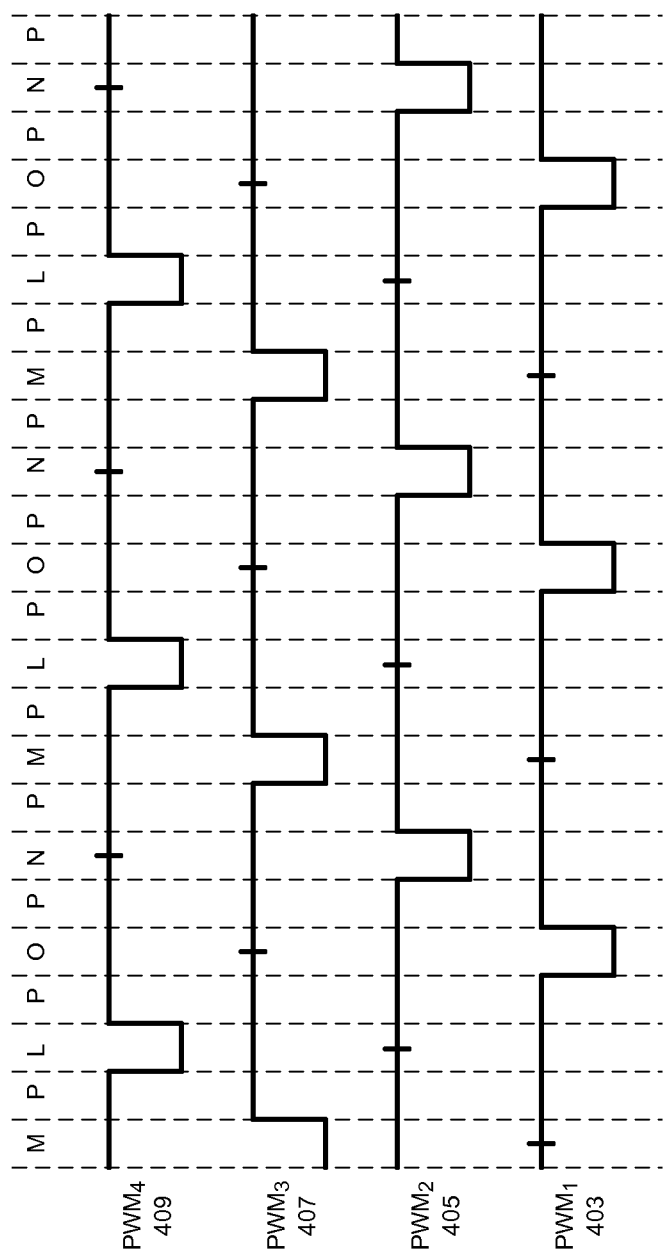
FIG. 18 illustrates a Timing Waveform of PCM to Quad Digital PWM for Envelope Tracking for the case that the PCM is limited between three fourth and one according to embodiments of the present inventions.

FIG. 18 illustrates a Timing Waveform of PCM to Quad Digital PWM for Envelope Tracking for the case that the PCM is limited between three fourth and one.

Exemplary timing waveforms of PCM to 4 digital PWM signals are illustrated in FIGS. 15 to 18. In general the mapping unit switches such that a center of the pulses of the N digital PWM signals are equally spaced from one another. Further the mapping unit switches signal transitions in symmetrical patterns time offset by like phase differences between the N digital PWM signals.

Figure 19:
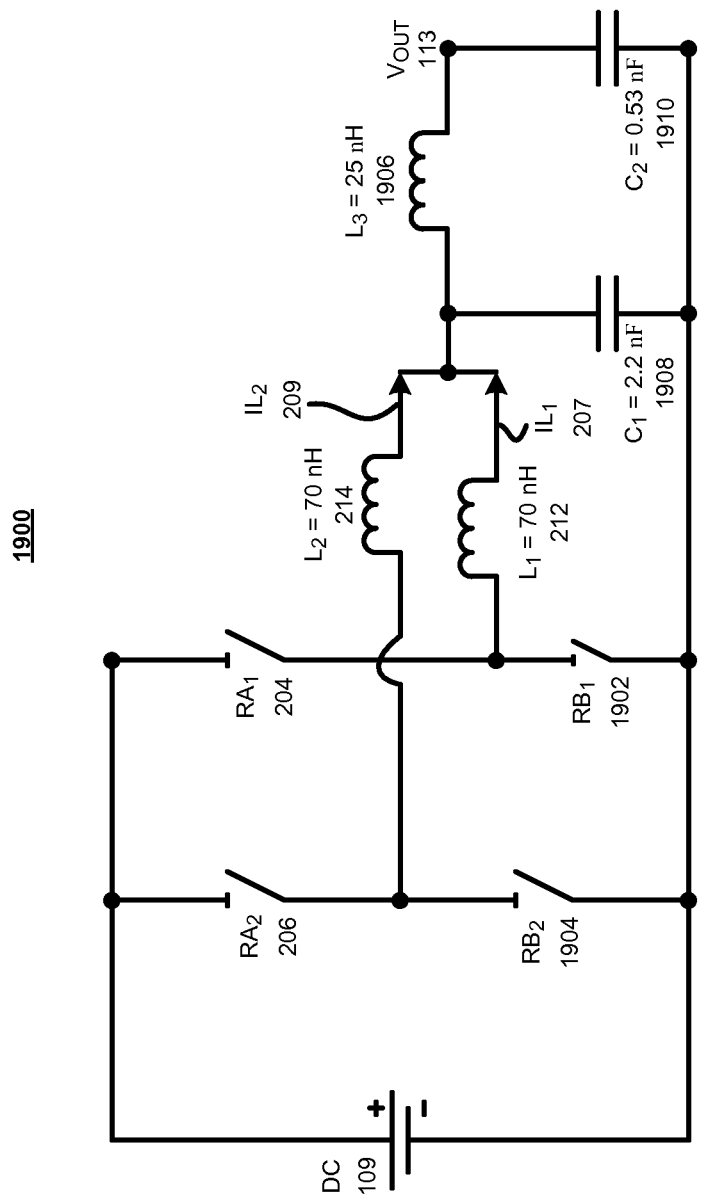
FIG. 19 illustrates a schematic diagram of a Dual Power Stage and Low Pass Filter according to according to embodiments of the present inventions.

FIG. 19 illustrates a schematic diagram of a dual Power Stage and Low Pass Filter according to embodiments. $RA_1$ 204 and $RA_2$ 206 are the high side switches connected to voltage source DC 109. Switches $RB_1$ 1902 and $RB_2$ 1904 are the low side switches connected to ground and implement diode functionality. Inductors $L_1$ 212 and $L_2$ 214 connect the switching to the Capacitor $C_1$ 1908. The currents in the inductors $L_1$ 212 and $L_2$ 214 are $IL_1$ 207 and $IL_2$ 209 respectively. Inductor $L_3$ 1906 takes combination of inputs of $L_1$ 212, $L_2$ 214, $IL_1$ 207 and $IL_1$ 209 and produces output $V_{OUT}$ 113. Capacitor $C_2$ 1910 is connected between the $V_{OUT}$ node 113 and ground.

Figure 20:
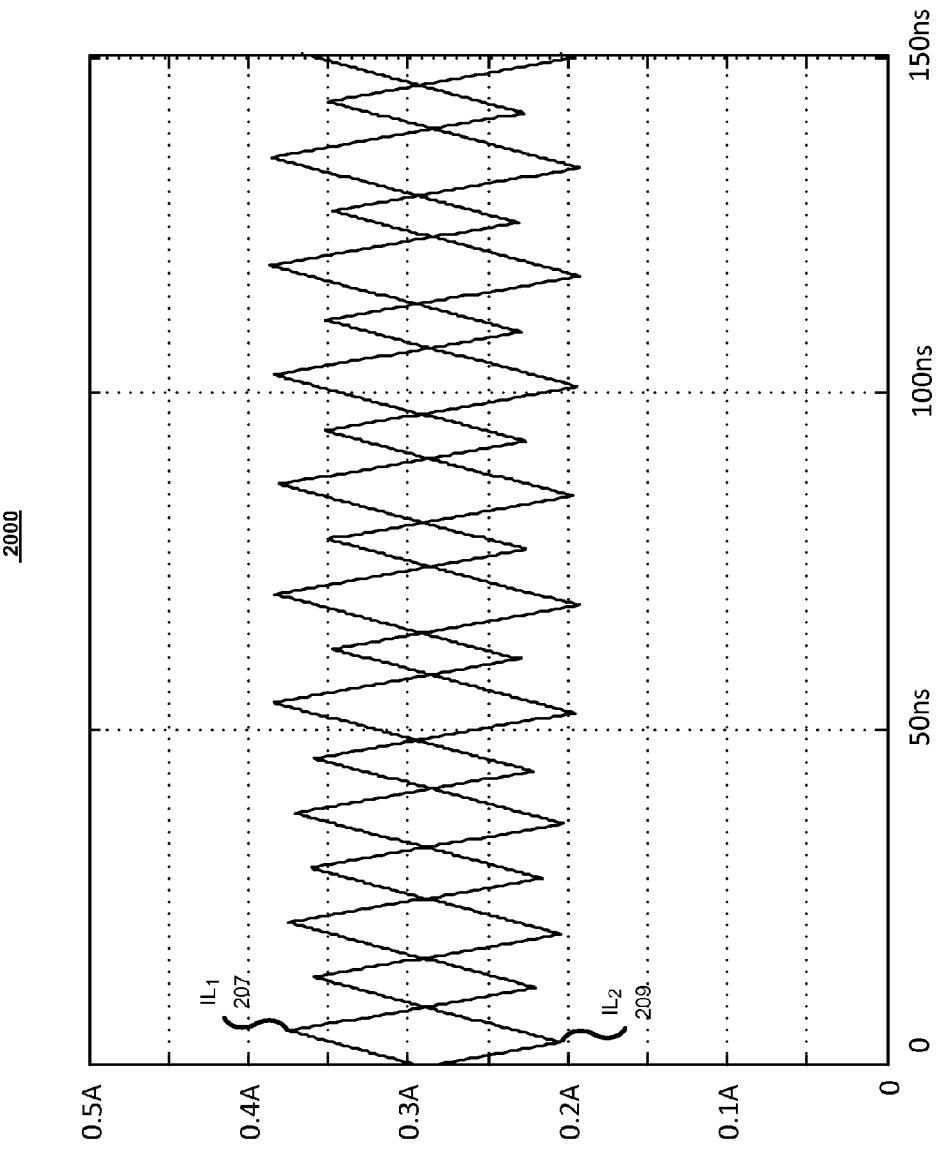
FIG. 20 illustrates a Plot over time of Inductor Currents without Imbalance Correction for a dual power stage according to embodiments of the present inventions.

FIG. 20 shows the time domain plot of the Inductor Currents without Imbalance Correction. Note that the currents are starting to diverge. If the modulation signal has content at sub harmonics of the PWM switching frequency the inductor current can even change polarity. This would result in significantly worse efficiency and linearity of the power stage.

Figure 21:
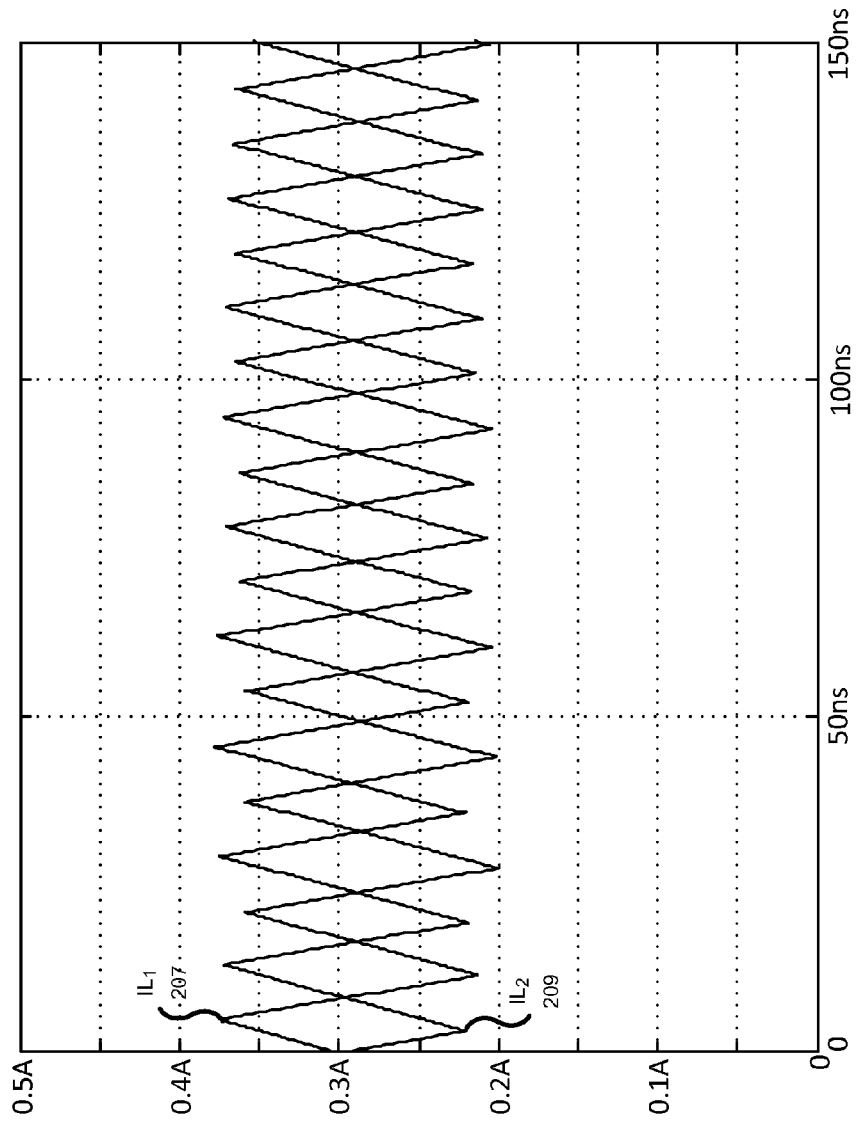
FIG. 21 illustrates a Plot over time of Inductor Currents with Imbalance Correction for a dual power stage according to embodiments of the present inventions.

FIG. 21 shows the time domain plot of the Inductor Currents with Imbalance Correction. Note that the currents are controlled to converge in a manner keep their average values even though their instantaneous values are quite different. The ripple has opposite phase so that the switching frequency is cancelled almost entirely.

Figure 22:
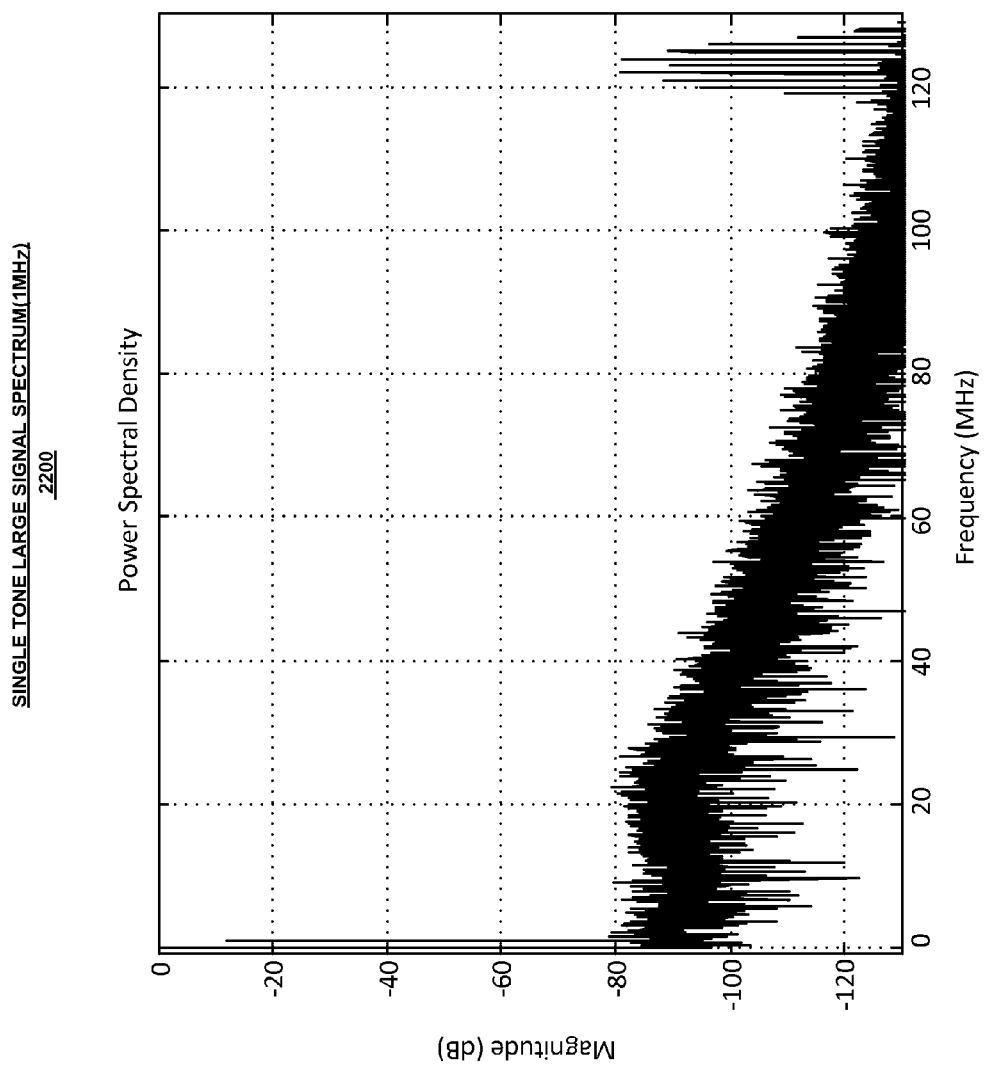
FIG. 22 illustrates a Spectrum Plot over frequency of Single Tone Large Signal Spectrum at 1 MHz for a dual power stage according to embodiments of the present inventions.

FIG. 22 illustrates a Spectrum Plot over frequency of Single Tone Large Signal Spectrum. The single tone is at 1 MHz. There is also large content at dc. The switching frequency is chosen to be at 61.44 MHz. The lowest undesired spectral content is around twice the switching frequency. This is significantly easier to filter than having content at the switching frequency.

Figure 23:
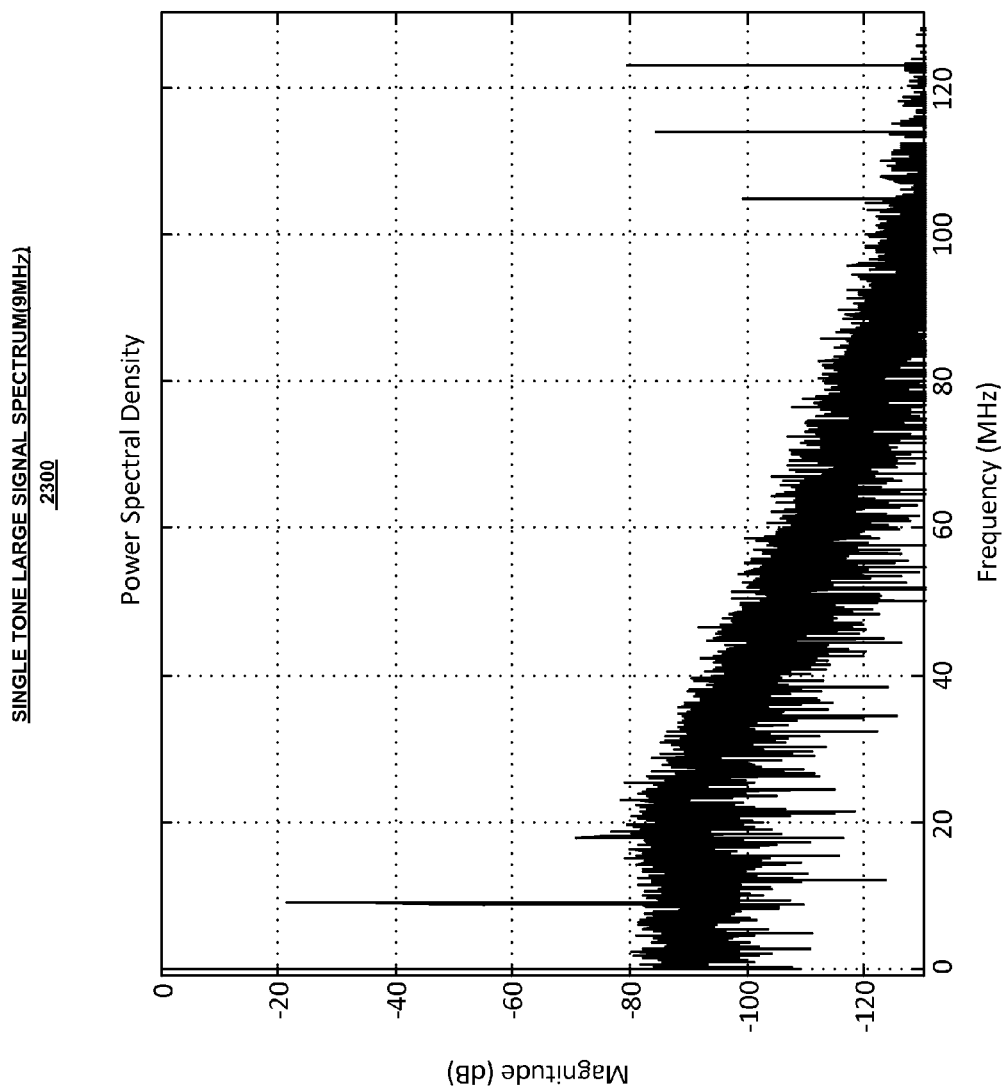
FIG. 23 illustrates a Spectrum Plot over frequency of Single Tone Large Signal Spectrum at 9 MHz for a dual power stage according to embodiments of the present inventions.

FIG. 23 illustrates a Spectrum Plot over frequency of Single Tone Large Signal Spectrum. The single tone is at 9 MHz. There is also large content at dc. The switching frequency is chosen to be at 61.44 MHz. The lowest undesired spectral content is at twice the switching frequency mixed with 9 MHz and its harmonics. This is significantly easier to filter than having content at the switching frequency. We also see a small nonlinearity at 18 MHz which is about 50 dB lower than the desired signal at 9 MHz.

Figure 24:
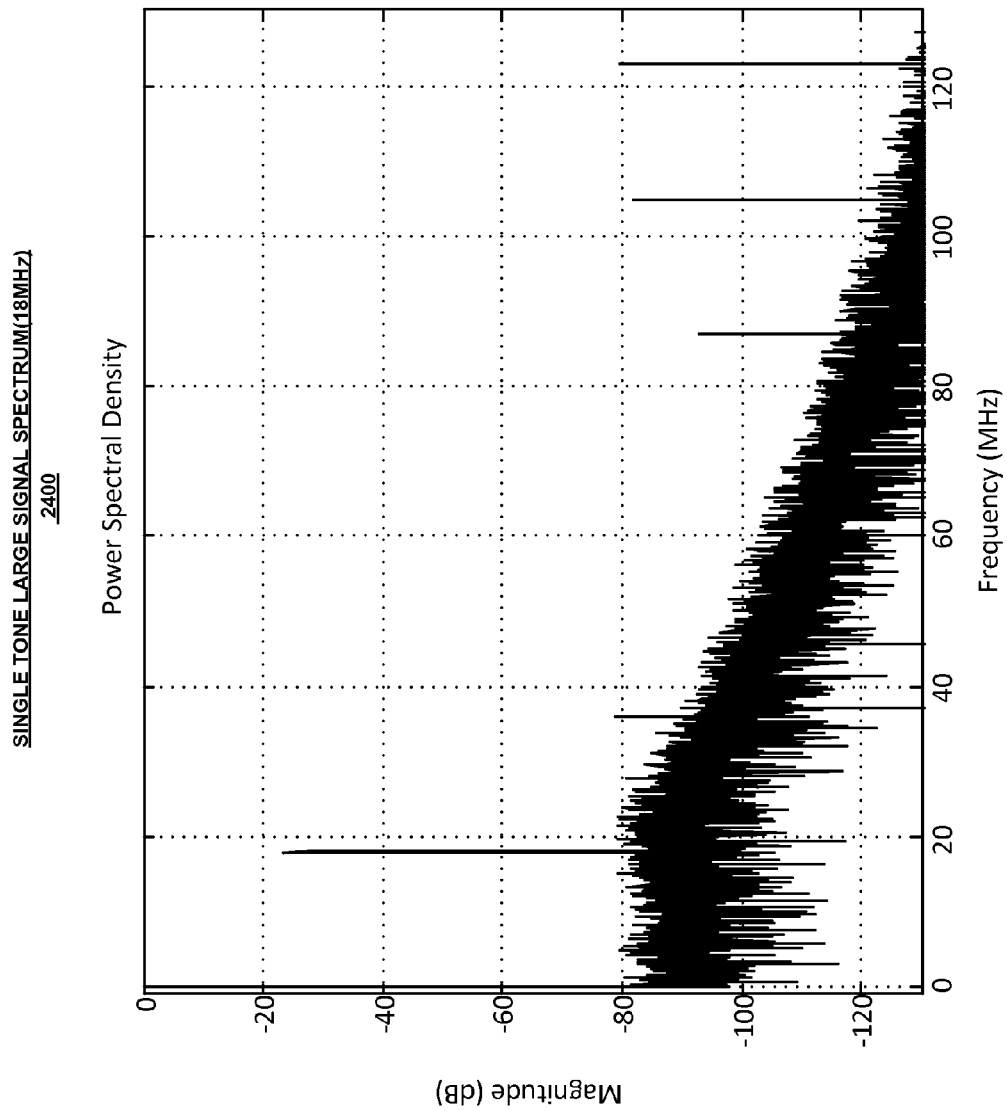
FIG. 24 illustrates a Spectrum Plot over frequency of Single Tone Large Signal Spectrum at 18 MHz for a dual power stag according to embodiments of the present inventions.

FIG. 24 illustrates a Spectrum Plot over frequency of Single Tone Large Signal Spectrum. The single tone is at 18 MHz. There is also large content at dc. The switching frequency is chosen to be at 61.44 MHz. The lowest undesired spectral content is at twice the switching frequency mixed with 18 MHz and its harmonics. This is significantly easier to filter than having content at the switching frequency. We also see a small nonlinearity at 36 MHz which is about 60 dB lower than the desired signal at 18 MHz.

Figure 25:
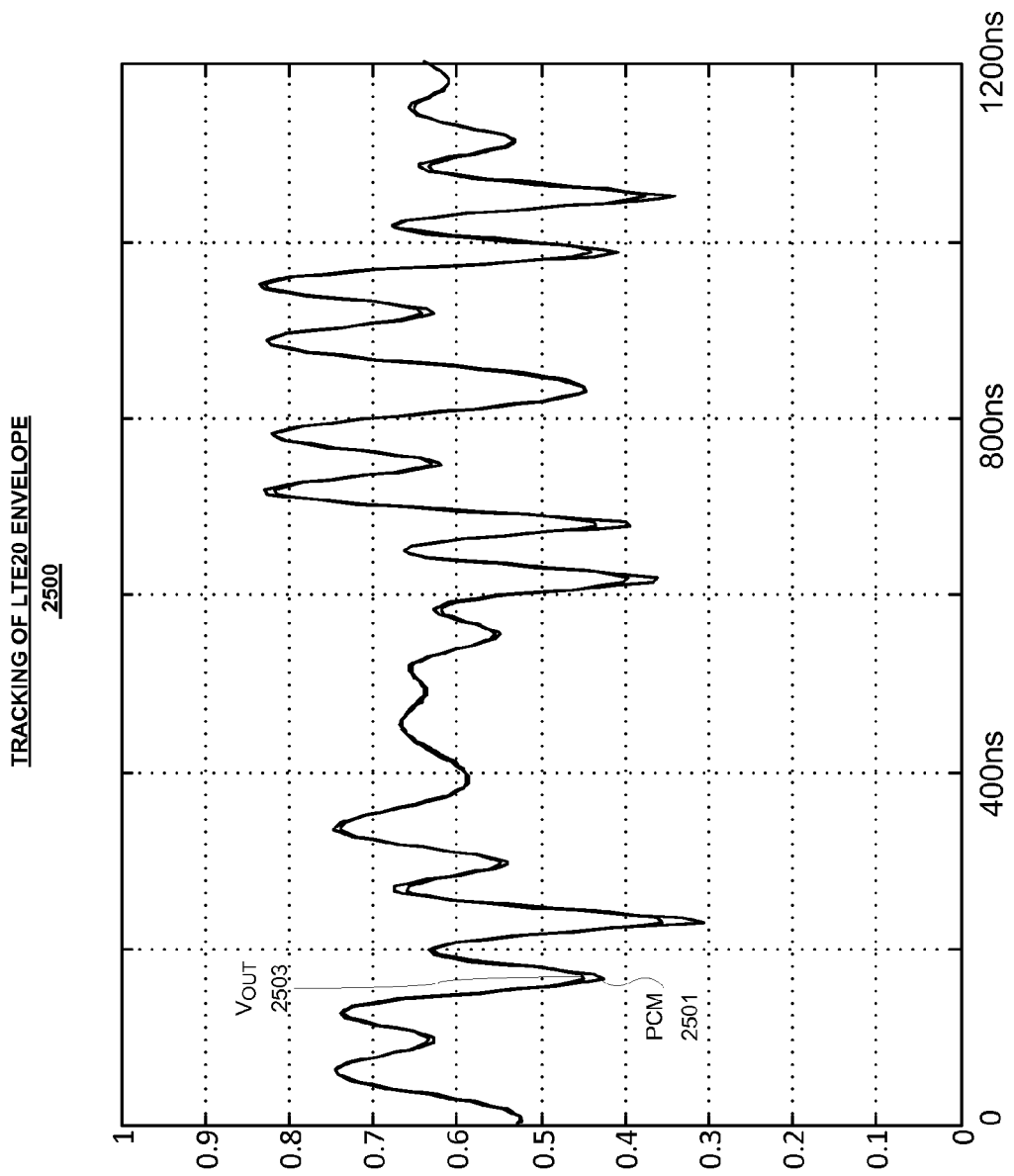
FIG. 25 illustrates a Tracking Plot over time LTE20 Envelope for a dual power stage according to embodiments of the present inventions.

FIG. 25 illustrates a Plot over time of Tracking of LTE20 Signal Spectrum. The signals shown are the reference and output voltage of the switcher normalized to unity. The small time delay through the LC filter has been compensated to illustrate the tracking accuracy better.

Figure 26:
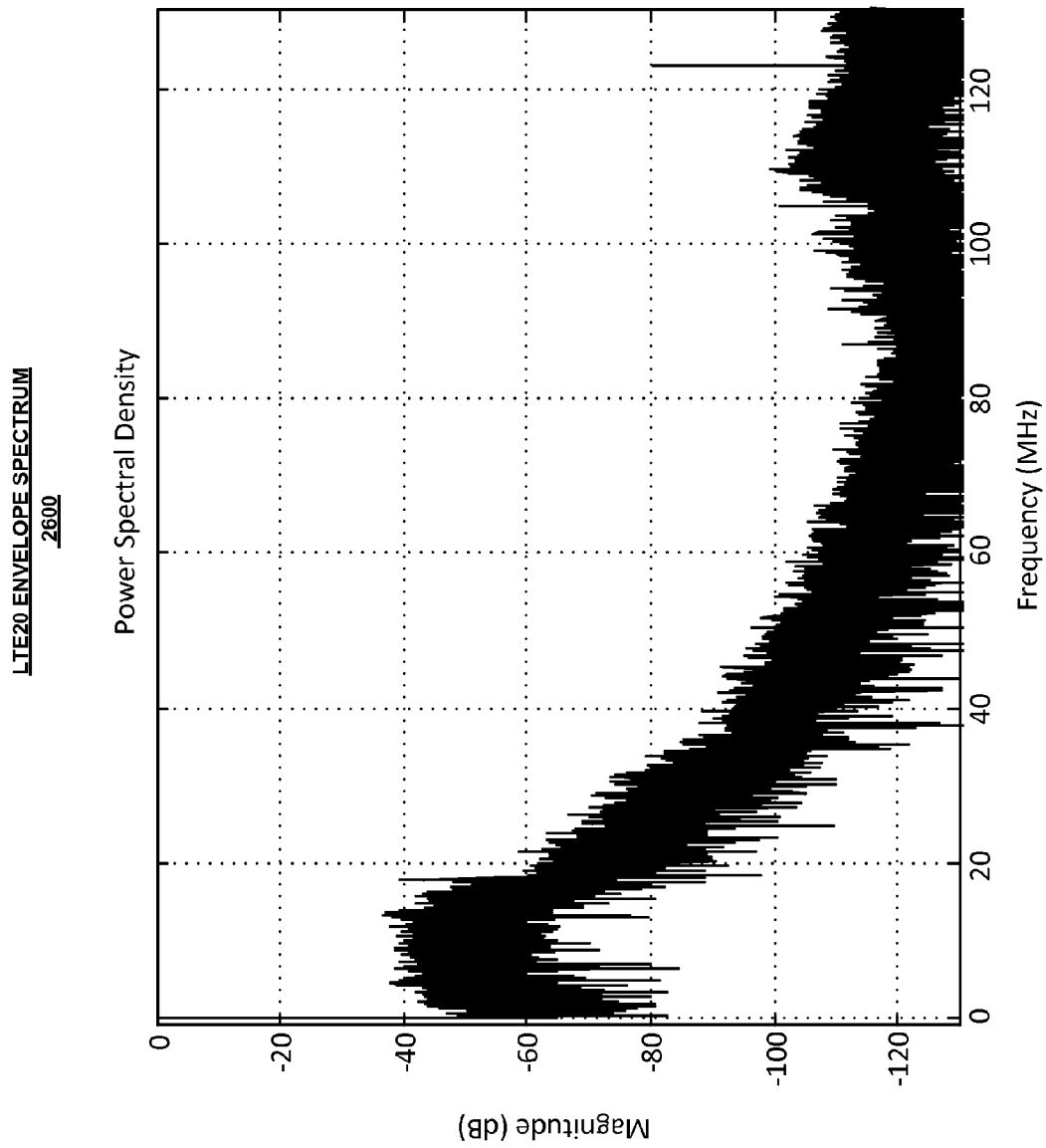
FIG. 26 illustrates a Spectrum Plot over frequency of LTE20 Envelope Spectrum for a dual power stage according to embodiments of the present inventions.

FIG. 26 illustrates a Plot over frequency spectrum of LTE20 Envelope. Note that the signal is high up to 18 MHz and then falls down gradually from that. There is a single spectral line at twice the switching frequency at 122.88 MHz.

Figure 27:
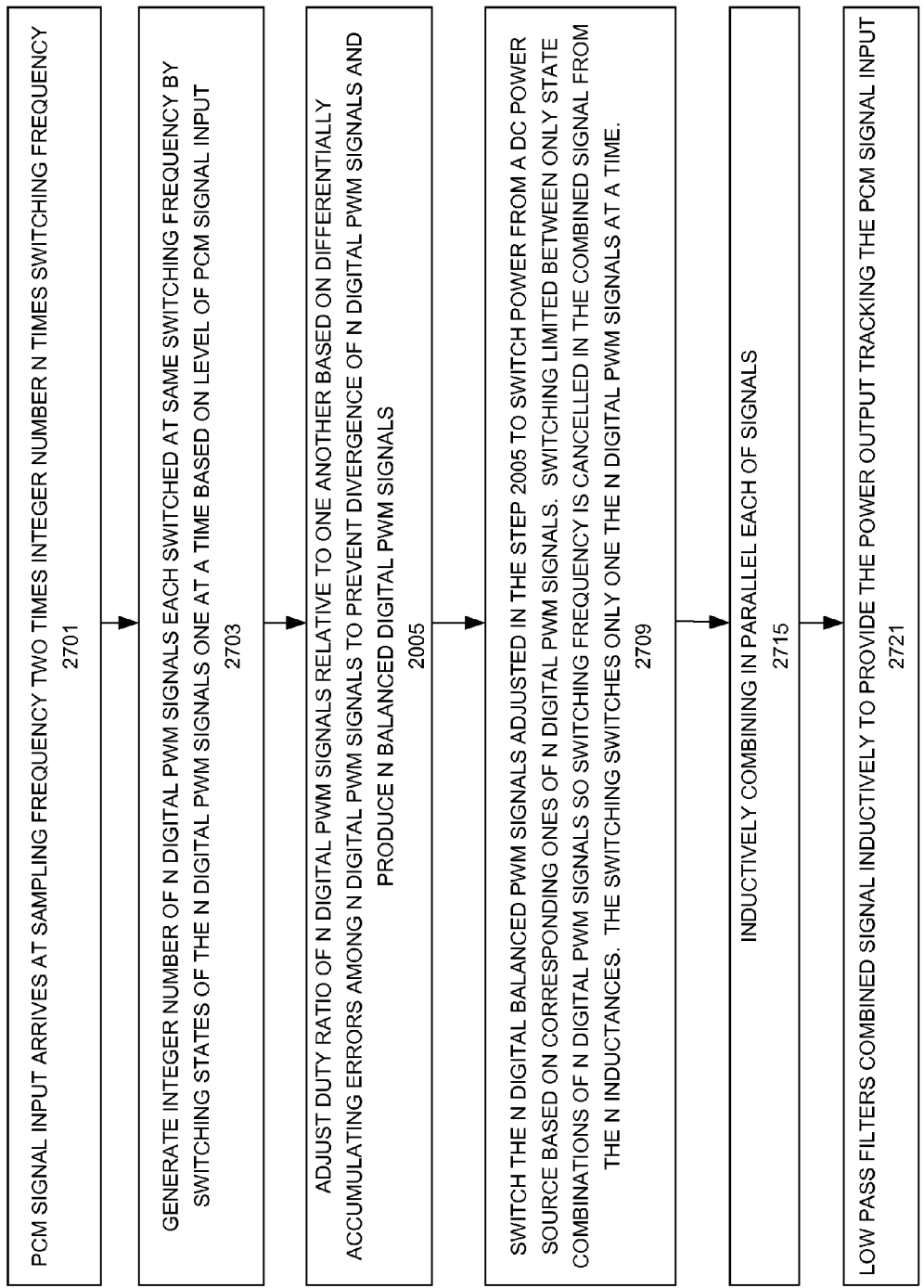
FIG. 27 illustrates a Flowchart of the system according to embodiments of the present inventions.

FIG. 27 illustrates a Flowchart of the system according to embodiments of the present inventions to provide a power output that tracks a PCM signal input. The PCM signal input arrives at a sampling frequency in step 2701. The sampling frequency of the PCM signal input is two times an integer number N times the switching frequency (2×N×F SW). Step 2703 generates the integer number of N digital PWM signals each switched at a same switching frequency by switching states of the N digital PWM signals one at a time based on a level of the PCM signal input. Step 2005 adjusts a duty ratio of the N digital PWM signals relative to one another based on differentially accumulating errors among the N digital PWM signals to prevent divergence of N digital PWM signals and produce N balanced digital PWM signals. Step 2709 switches the N digital balanced PWM signals adjusted in the step 2005 to switch power from a DC power source based on corresponding ones of N digital PWM signals. The switching in step 2709 is limited to switching between only those state combinations of the N digital PWM signals such that the switching frequency is cancelled in the combined signal from the N inductances. The switching in said step 2709 switches only one the N digital PWM signals at a time. Step 2715 inductively combines in parallel each of the signals switched in the step 2709. Step 2721 low pass filters the combined signal inductively combined in the step 2715 to provide the power output tracking the PCM signal input.

Many of the signal processing techniques disclosed herein with reference to the accompanying drawings are preferably implemented on one or more digital signal processors (DSPs) or other microprocessors. Nevertheless, such techniques could instead be implemented wholly or partially as hard-wired circuits. Further, it is appreciated by those of skill in the art that certain well known digital processing techniques are mathematically equivalent to one another and can be represented in different ways depending on choice of implementation.

Any letter designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

Any trademarks listed herein are the property of their respective owners, and reference herein to such trademarks is generally intended to indicate the source of a particular product or service.

Although the inventions have been described and illustrated in the above description and drawings, it is understood that this description is by example only, and that numerous changes and modifications can be made by those skilled in the art without departing from the true spirit and scope of the inventions. Although the examples in the drawings depict only example constructions and embodiments, alternate embodiments are available given the teachings of the present patent disclosure.

What is claimed is:

1. A DC power stage for providing a power output that tracks a PCM signal input, comprising:

a mapping unit for generating an integer number of N digital PWM signals each switched at a same switching frequency by switching states of the N digital PWM signals one at a time based on a level of the PCM signal input;

an imbalance correction unit operatively coupled to the mapping unit to adjust a duty ratio of the N digital PWM signals relative to one another based on differentially accumulating errors among the N digital PWM signals to prevent divergence of N digital PWM signals and produce N balanced digital PWM signals;

N switches each operatively coupled to a corresponding one of the N digital balanced PWM signals from the imbalance correction unit to switch power from a DC power source based on the corresponding one of N balanced digital PWM signals;

N inductances in parallel, each of the N inductances operatively coupled to a corresponding one of the N switches to produce a combined signal; and a low pass filter operatively coupled to filter the combined signal from the N inductors and provide the power output tracking the PCM signal input.

2. A DC power stage according to claim 1, wherein the switching of the mapping unit is limited to switching between only those state combinations of the N digital PWM signals such that the switching frequency is cancelled in the combined signal from the N inductances.

3. A DC power stage according to claim 1,
wherein the PCM signal input arrives at a sampling frequency; and
wherein the mapping unit switches each of the N digital PWM signals at the switching frequency that is the sampling frequency of the PCM signal input divided by a product of 2 times the integer number N.

4. A DC power stage according to claim 3, wherein the switching of the mapping unit is limited to switching between only those state combinations of the N digital PWM signals such that the switching frequency is cancelled in the combined signal from the N inductances.

5. A DC power stage according to claim 1, wherein each of the N inductances have essentially a same inductance value so that the N balanced digital PWM signals are each essentially the same magnitude.

6. A DC power stage according to claim 1, wherein the mapping unit switches such that a center of the pulses of the N digital PWM signals are equally spaced from one another.

7. A DC power stage according to claim 1, wherein the mapping unit switches signal transitions in symmetrical patterns time offset by like phase differences between the N digital PWM signals.

8. A DC power stage according to claim 1, wherein the mapping unit switches signal transitions in like patterns with common states.

9. A DC power stage according to claim 1, wherein the mapping unit switches the N digital PWM signals in the integer number N of transitions between N plus 1 layers of $2^N$ states.

10. A DC power stage according to claim 9, wherein the transitions alternate between layers.

11. A DC power stage according to claim 9, wherein every other transition returns to an adjacent state on a same layer within one of N ranges of values of the N digital PCM signals.

12. A DC power stage apparatus according to claim 1, wherein the integer number N is 2.

13. A DC power stage apparatus according to claim 1, wherein the integer number N is 3.

14. A DC power stage apparatus according to claim 1, wherein the integer number N is 4.

15. A two-stage DC power stage for providing a power output that tracks a PCM signal input having a sampling frequency, comprising:
 a mapping unit for generating a first digital PWM signal and a second digital PWM signal each switched at a same switching frequency by switching states of the first digital PWM signal and the second digital PWM signal one at a time based on a level of the PCM signal input;
 an imbalance correction unit operatively coupled to the mapping unit to adjust a duty ratio of the first and second digital PWM signals relative to one another based on differential accumulation of an error between the first and second digital PWM signals to prevent divergence of the first and second digital PWM signals and produce first and second balanced digital PWM signals;
 a two stage switch consisting of essentially no more than two switches, each of the two switches operatively coupled to a corresponding one of the first and second balanced PWM signals from the imbalance correction unit to switch power from a DC power source based on the corresponding one of the first and second balanced digital PWM signals;
 two inductances in parallel, each of the two inductances operatively coupled to a corresponding one of the two switches to produce a combined signal; and
 a low pass filter operatively coupled to filter the combined signal from the N inductors and provide the power output tracking the PCM signal input; and
 wherein the mapping unit switches each of the first and second digital PWM signals at the switching frequency that is one-quarter of the sampling frequency of the PCM signal input.

16. A two-stage DC power stage according to claim 15, wherein the switching of the mapping unit is limited to switching between only those state combinations of the first and second digital PWM signals such that the switching frequency is cancelled in the combined signal from the two inductances.

17. A method of providing a power output that tracks a PCM signal input, comprising the steps of:
 (a) generating an integer number of N digital PWM signals each switched at a same switching frequency by switching states of the N digital PWM signals one at a time based on a level of the PCM signal input;
 (b) adjusting a duty ratio of the N digital PWM signals relative to one another based on differentially accumulating errors among the N digital PWM signals to prevent divergence of N digital PWM signals and produce N balanced digital PWM signals;
 (c) switching the N digital balanced PWM signals adjusted in said step (b) to switch power from a DC power source based on corresponding ones of N digital balanced PWM signals;
 (d) inductively combining in parallel each of the signals switched in said step (c); and
 (e) low pass filtering the combined signal inductively combined in said step (d) to provide the power output tracking the PCM signal input.

18. A method according to claim 17, wherein the switching of the N digital PWM signals generated in said step (a) is limited to switching between only those state combinations of the N digital PWM signals such that the switching frequency is cancelled in the combined signal from the N inductances.

19. A method according to claim 17,
 wherein the PCM signal input arrives at a sampling frequency; and
 wherein the switching of the N digital PWM signals generated in said step (a) switches each of the N digital PWM signals at the switching frequency that is the sampling frequency of the PCM signal input divided by a product of 2 times the integer number N.

20. A method according to claim 19, wherein the switching of the N digital PWM signals generated in said step (a) is limited to switching between only those state combinations of the N digital PWM signals such that the switching frequency is cancelled in the combined signal from the N inductances.

* * * * *